US012712045B2

(12) United States Patent
Islam et al.

(10) Patent No.: US 12,712,045 B2
(45) Date of Patent: Aug. 18, 2026

(54) VARIABLE RESISTANCE FOR CURRENT CONTROL IN NONVOLATILE MEMORY ARRAYS

(71) Applicant: Sandisk Technologies, Inc., Milpitas, CA (US)

(72) Inventors: Ashraf B. Islam, El Dorado Hills, CA (US); Jaydip Patel, Folsom, CA (US); Nicolas Irizarry, Folsom, CA (US); William Sheung, Folsom, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 102 days.

(21) Appl. No.: 18/648,506

(22) Filed: Apr. 29, 2024

(65) Prior Publication Data

US 2025/0336460 A1 Oct. 30, 2025

(51) Int. Cl.
*G11C 29/12* (2006.01)
*G11C 29/30* (2006.01)
*G11C 29/36* (2006.01)

(52) U.S. Cl.
CPC .... *G11C 29/1201* (2013.01); *G11C 29/12015* (2013.01); *G11C 29/30* (2013.01); *G11C 29/36* (2013.01)

(58) Field of Classification Search
CPC .......... G11C 29/1201; G11C 29/12015; G11C 29/30; G11C 29/36
See application file for complete search history.

(56) References Cited

U.S. PATENT DOCUMENTS 8,848,426 B2 9/2014 Azuma et al.
10,553,647 B2 2/2020 Grobis et al.
10,937,497 B2 3/2021 Bertin et al.
11,222,259 B2 1/2022 Koswatta et al.
2008/0158932 A1 7/2008 Khellah et al.
2012/0155149 A1* 6/2012 Maejima ................ G11C 13/00 365/148
2014/0112055 A1* 4/2014 Kawahara ............. G11C 13/00 365/148

(Continued)

FOREIGN PATENT DOCUMENTS

TW 200802362 A 1/2008
TW 201013675 A 4/2010

(Continued)

OTHER PUBLICATIONS

International Search Report dated Jun. 3, 2025, International Application No. PCT/US2025/011242.

*Primary Examiner* — Mohammed A Bashar
(74) *Attorney, Agent, or Firm* — Pearl Cohen LLP

(57) ABSTRACT

An apparatus includes one or more control circuit configured to connect to a nonvolatile memory cell structure that includes nonvolatile memory cells each having a programmable resistive element. The one or more control circuit is configured to receive an address that corresponds to a location in the nonvolatile memory cell structure and set a variable resistor according to the location. The variable resistor is connected in series with a selected nonvolatile memory cell that is located at the location. The one or more control circuit is further configured to drive a memory access current through the selected nonvolatile memory cell and the variable resistor in series.

20 Claims, 26 Drawing Sheets

(56) References Cited

U.S. PATENT DOCUMENTS

| | | | |
|---|---|---|---|
| 2014/0219003 | A1 | 8/2014 | Ebsen et al. |
| 2020/0350010 | A1 | 11/2020 | Chou et al. |
| 2021/0241828 | A1 | 8/2021 | Banerjee et al. |
| 2022/0139454 | A1 | 5/2022 | Robertson et al. |
| 2023/0317130 | A1 | 10/2023 | Dinnipati et al. |

FOREIGN PATENT DOCUMENTS

| | | | |
|---|---|---|---|
| TW | 202318640 | A | 5/2023 |
| TW | 202412005 | A | 3/2024 |

* cited by examiner

120
Host
Host Processor
122
Host Memory
124
128
PCIe Interface
126
130
PCIe
100
Memory System
102
Controller
104
Memory Packages
BEP
112
FEP
110
DDR
106
DRAM/ ReRAM/ MRAM

110

4 channels for communicating with Memory Packages
4 channels for communicating with Memory Packages
TM Interface
Buffer
Scheduler
228
258
202
204
112
NOC
Buffer
SRAM
232
230
262
260
Data Path Controller
222
252
ECC
226
256
XOR
224
254
Processor
220
250
PCIe Interface to FEP
200

502/602

$WL_{2,4}$
$WL_{2,3}$
$WL_{2,2}$
$WL_{2,1}$
$WL_{1,4}$
$WL_{1,3}$
$WLB_{1,2}$
$WL_{1,1}$
$BL_1$
$BL_2$
$BL_3$
$BL_4$
$BL_5$
701
701
502/602
720
718

Figure 9

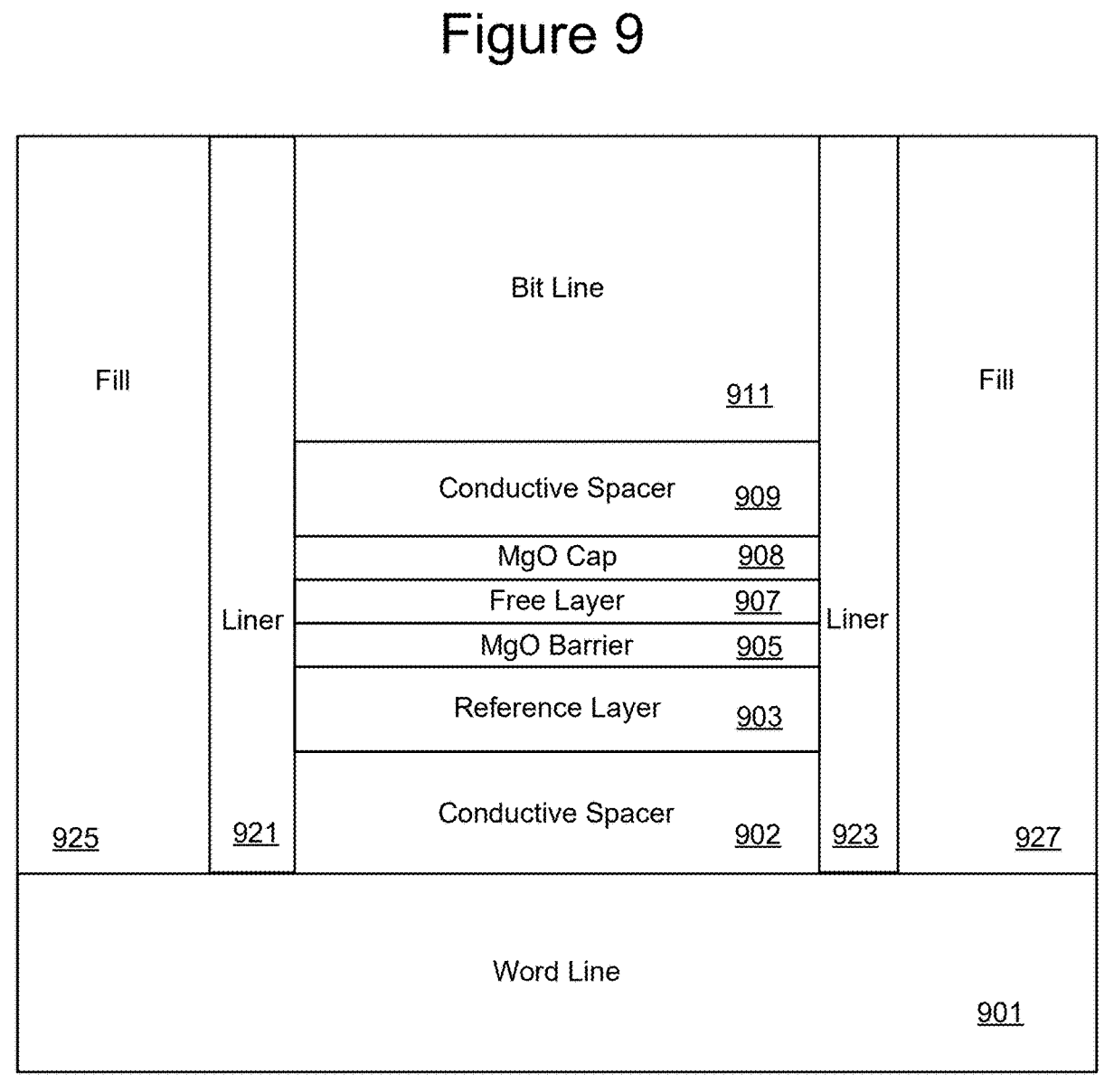

Fill 927

Liner 923

Bit Line 911

Conductive Spacer 909

MgO Cap 908

Free Layer 907

MgO Barrier 905

Reference Layer 903

Conductive Spacer 902

Liner 921

Fill 925

Word Line 901

BL decoder
BL Driver
650
WL Driver
660
Unselected BL
Unselected BL
Unselected WL
Unselected WL
1330
1332
1334
1336
1338
1339

BL Driver
650
1346
RBL
1342
RWL
Unselected
WL
WL Driver
660
1330
1344
Unselected
WL Story0

VPP
1570
$R_{VAR}$
WL Driver 660
$R_{WL}$
1450
Selector
MRAM
$R_{BL}$
BL Driver 650
Ireset
VNN

VPP $R_1$ $R_2$ $R_3$ $R_N$ $R_{VAR}$

1570

Address 1782
Digital Media Control Circuit 1780
Additional Input 1784
1786
1792
Core (#N Bank)
Bank (#n module)
Bank Controller 1788
Record 1790
Module
Module Logic 1794
VPP
VNN
$R_{VAR1}$
$R_{VAR2}$
1570
1571

Figure 18

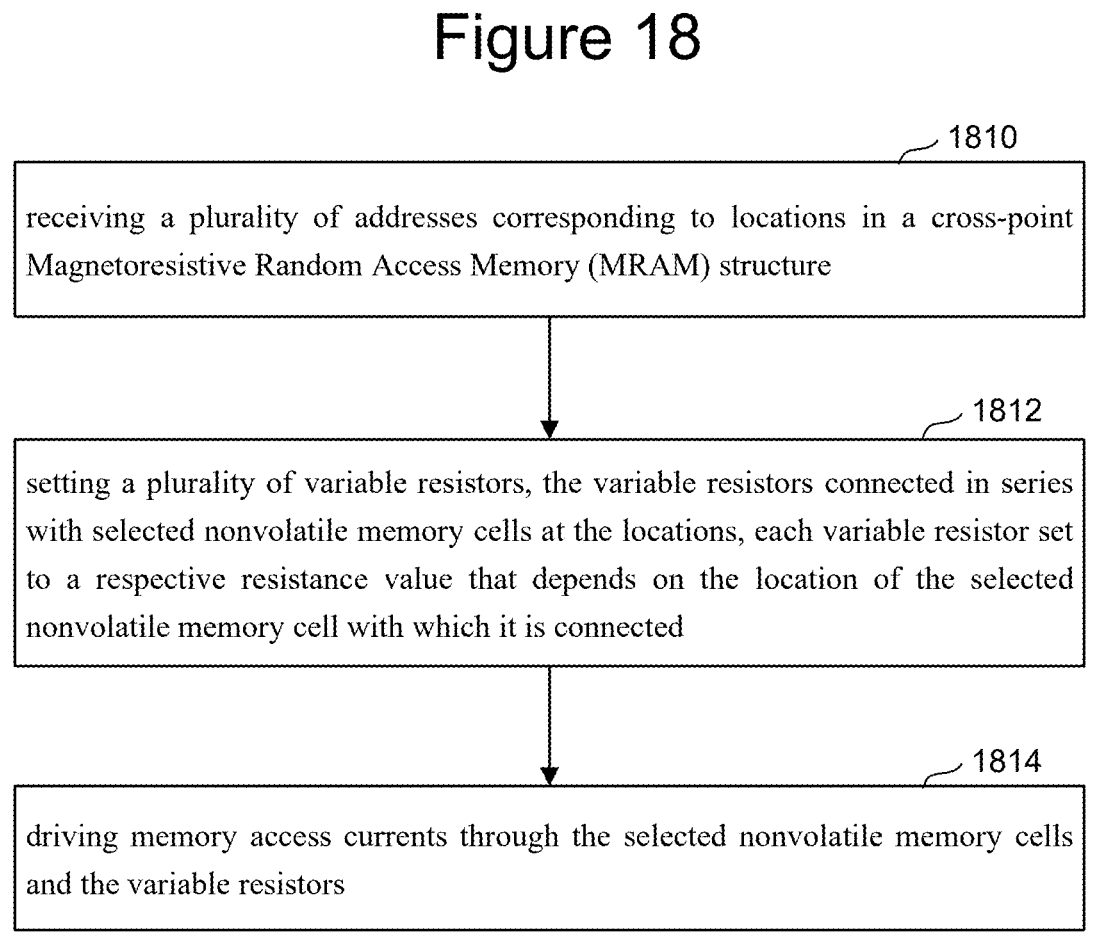

1810 receiving a plurality of addresses corresponding to locations in a cross-point Magnetoresistive Random Access Memory (MRAM) structure

1812 setting a plurality of variable resistors, the variable resistors connected in series with selected nonvolatile memory cells at the locations, each variable resistor set to a respective resistance value that depends on the location of the selected nonvolatile memory cell with which it is connected

1814 driving memory access currents through the selected nonvolatile memory cells and the variable resistors

VARIABLE RESISTANCE FOR CURRENT CONTROL IN NONVOLATILE MEMORY ARRAYS

BACKGROUND

Memory is widely used in various electronic devices such as cellular telephones, digital cameras, personal digital assistants, medical electronics, mobile computing devices, non-mobile computing devices, and data servers. Memory may comprise nonvolatile memory or volatile memory. A non-volatile memory allows information to be stored and retained even when the nonvolatile memory is not connected to a source of power (e.g., a battery).

One example of a nonvolatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

Although MRAM is a promising technology, various phenomena may cause errors in data stored in MRAM. Error Correction Code (ECC) may be used to correct such errors. Correcting errors using ECC may require significant resources and take significant time. In some cases, data may have too many errors to correct using a given ECC scheme. Such data may be considered Uncorrectable by ECC or "UE." For example, non-uniform currents (e.g., non-uniform write currents used to write or program memory cells) may result in significant errors if not adequately managed.

BRIEF DESCRIPTION OF THE DRAWING

Like-numbered elements refer to common components in the different figures.

FIG. 9 illustrates an embodiment for an MRAM memory cell design as it would be implemented in a cross-point array in more detail.

FIG. 15A-D show schematics of examples of access currents passing through nonvolatile memory cells in series with variable resistors.

FIG. 16 shows an example of a variable resistor.

FIG. 18 shows an example of a method that includes setting a plurality of variable resistors.

DETAILED DESCRIPTION

In a memory array with a cross-point type architecture, a first set of conductive lines run across the surface of a substrate (e.g., word lines or WLs) and a second set of conductive lines run over the substrate in a direction perpendicular to the first set of conductive lines (e.g., bit lines or BLs). The memory cells are located at the cross-point junctions of the two sets of conductive lines. Embodiments for the memory cells can include a programmable resistance element, such as an MRAM element, which may be connected in series with a selector switch in such a cross-point memory structure.

In some memory structures, including cross-point MRAM memory structures, word line resistance and bit line resistance in series with a memory cell may not be uniform for all memory cells. For example, depending on the location of a memory cell in a memory structure, the memory cell may be connected by longer lines (e.g., WL and/or BL) resulting in higher series resistance or by shorter lines resulting in lower series resistance. Nonuniformity in series resistance of lines for different memory cells may cause nonuniformity in memory access (e.g., data write operations), which may generate errors in stored data. Aspects of the present technology provide technical solutions to the technical problems associated with non-uniform currents when accessing different memory cells in a memory structure (e.g., due to different lengths of lines for memory cells at different locations, which result in different resistance in series with cells being accessed).

According to aspects of the present technology, a variable resistor may be connected in series with a selected memory cell (and in series with corresponding selected WL and BL) and the resistance of the variable resistor may be set to a value that depends on the location of the selected memory cell and/or other factors. For example, for memory cells at locations that result in high series resistance (e.g., due to long WL and/or BL) the variable resistor may be set to a low value while for memory cells at locations that result in low series resistance (e.g., due to short WL and/or BL) the variable resistor may be set to a high value. In this way, the variable resistor may be used to compensate for different WL and BL resistances associated with different locations in a memory structure (e.g., total series resistance of WL, BL and variable resistor may be kept substantially equal for all memory cells). A variable resistor connected in series may also be controlled according to temperature and/or other factors.

Figure 1:
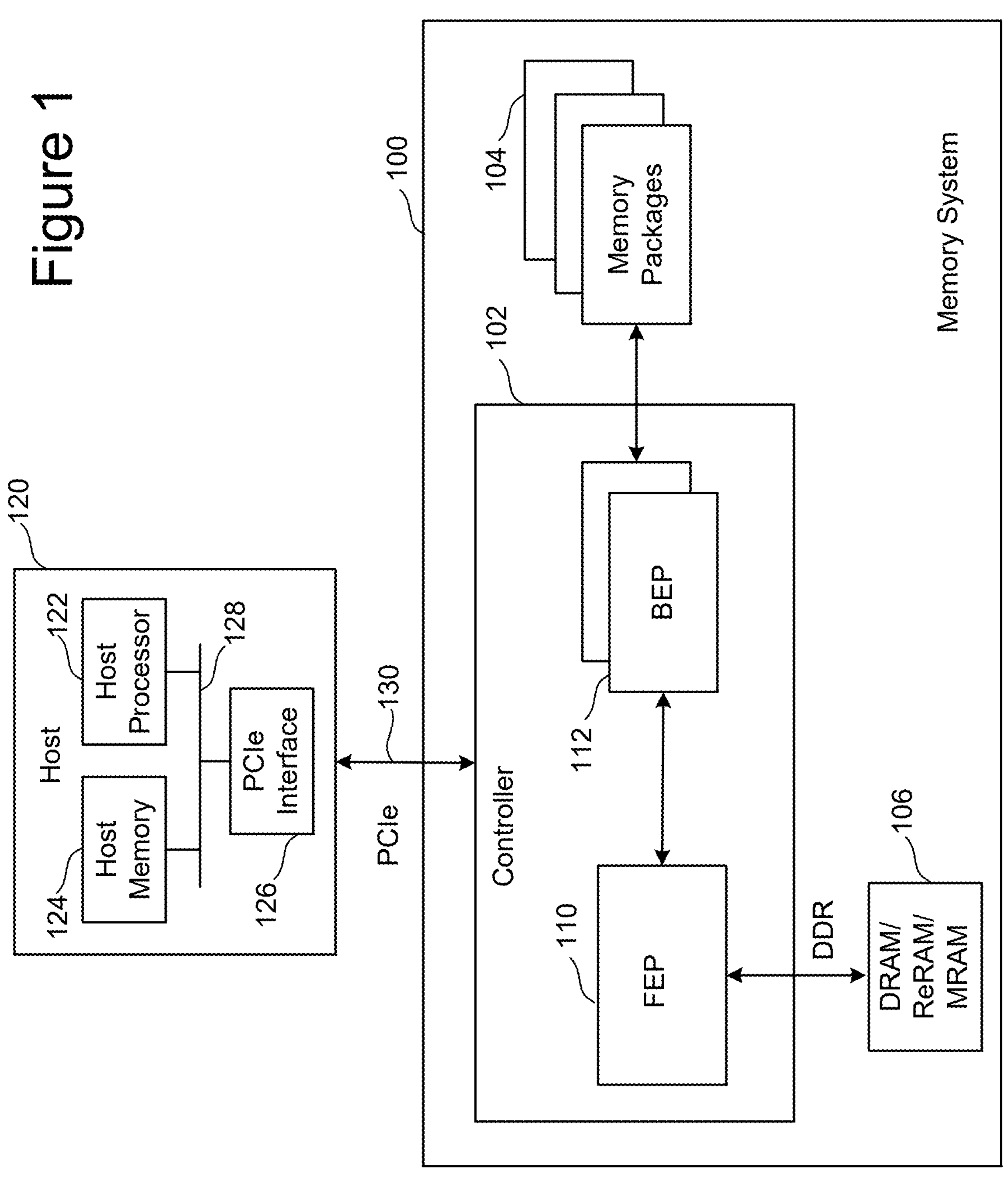
FIG. 1 is a block diagram of one embodiment of a memory system connected to a host.

FIG. 1 is a block diagram of one embodiment of a memory system 100 connected to a host 120. Memory system 100 can implement the technology presented herein for managing error rates. Many different types of memory systems can be used with the technology proposed herein. Example memory systems include solid state drives ("SSDs"), memory cards including dual in-line memory modules (DIMMs) for DRAM replacement, and embedded memory devices; however, other types of memory systems can also be used.

Memory system 100 of FIG. 1 comprises a controller 102, nonvolatile memory 104 for storing data, and local memory (e.g., DRAM/ReRAM/MRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other nonvolatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, nonvolatile memory 104 comprises a plurality of memory packages. Each memory package includes one or more memory die. Therefore, controller 102 is connected to one or more nonvolatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In other embodiments, the BEP or FEP can be included on the memory die.

Controller 102 communicates with host 120 via an interface 130 that implements a protocol such as, for example, NVM Express (NVMe) or Compute Express Link (CXL) over PCI Express (PCIe) or using JEDEC standard Double Data Rate or Low-Power Double Data Rate (DDR or LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, MRAM, nonvolatile memory, or another type of storage. Host 120 is external to and separate from memory system 100. In one embodiment, memory system 100 is embedded in host 120.

Figure 2:
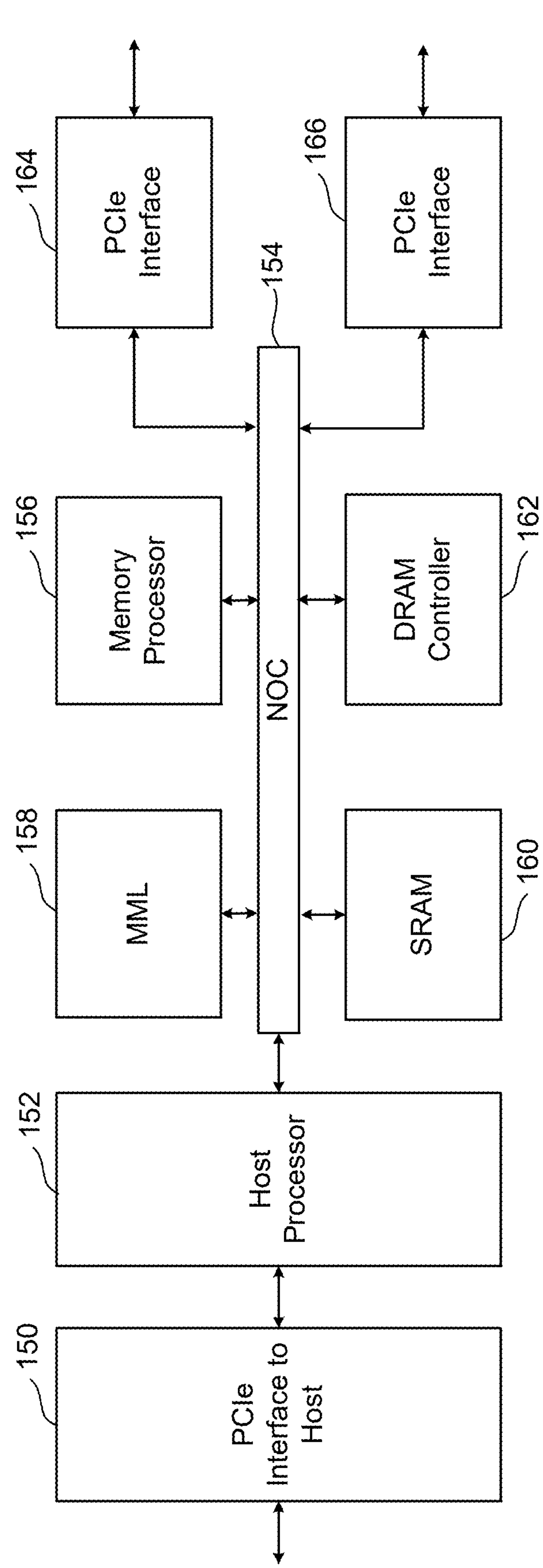
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other nonvolatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502/602 of FIGS. 5 and 6 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
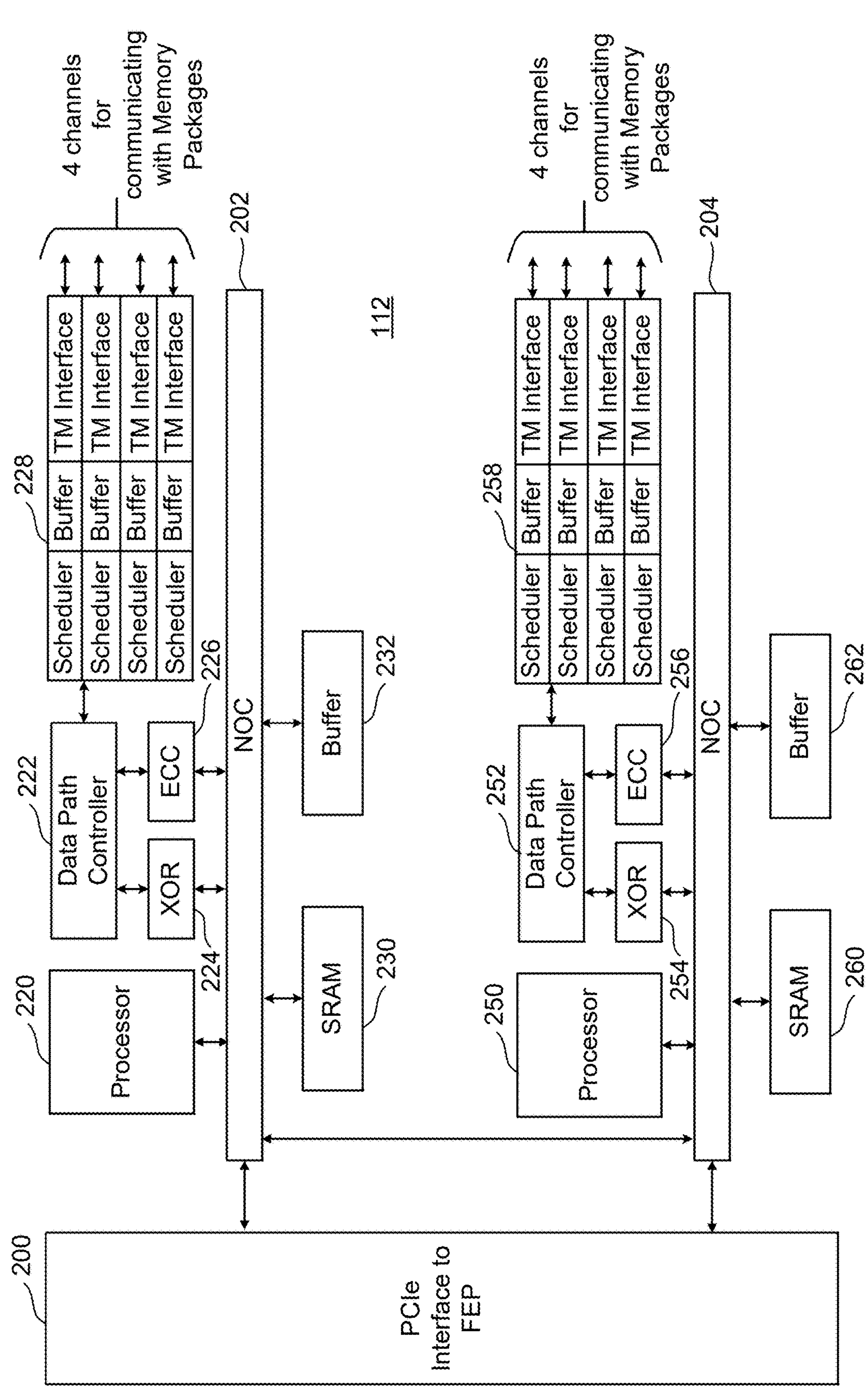
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
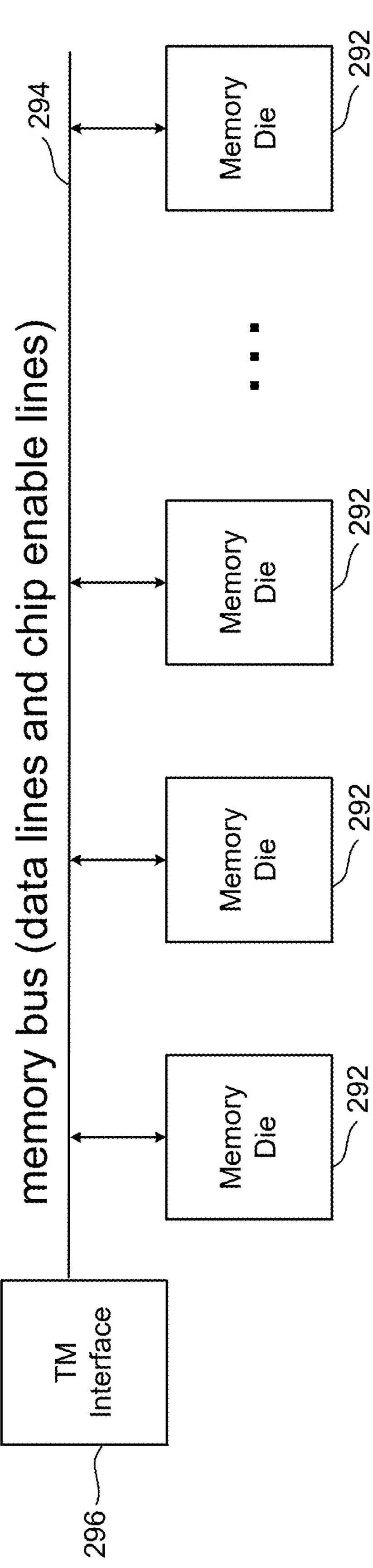
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

Figure 5:
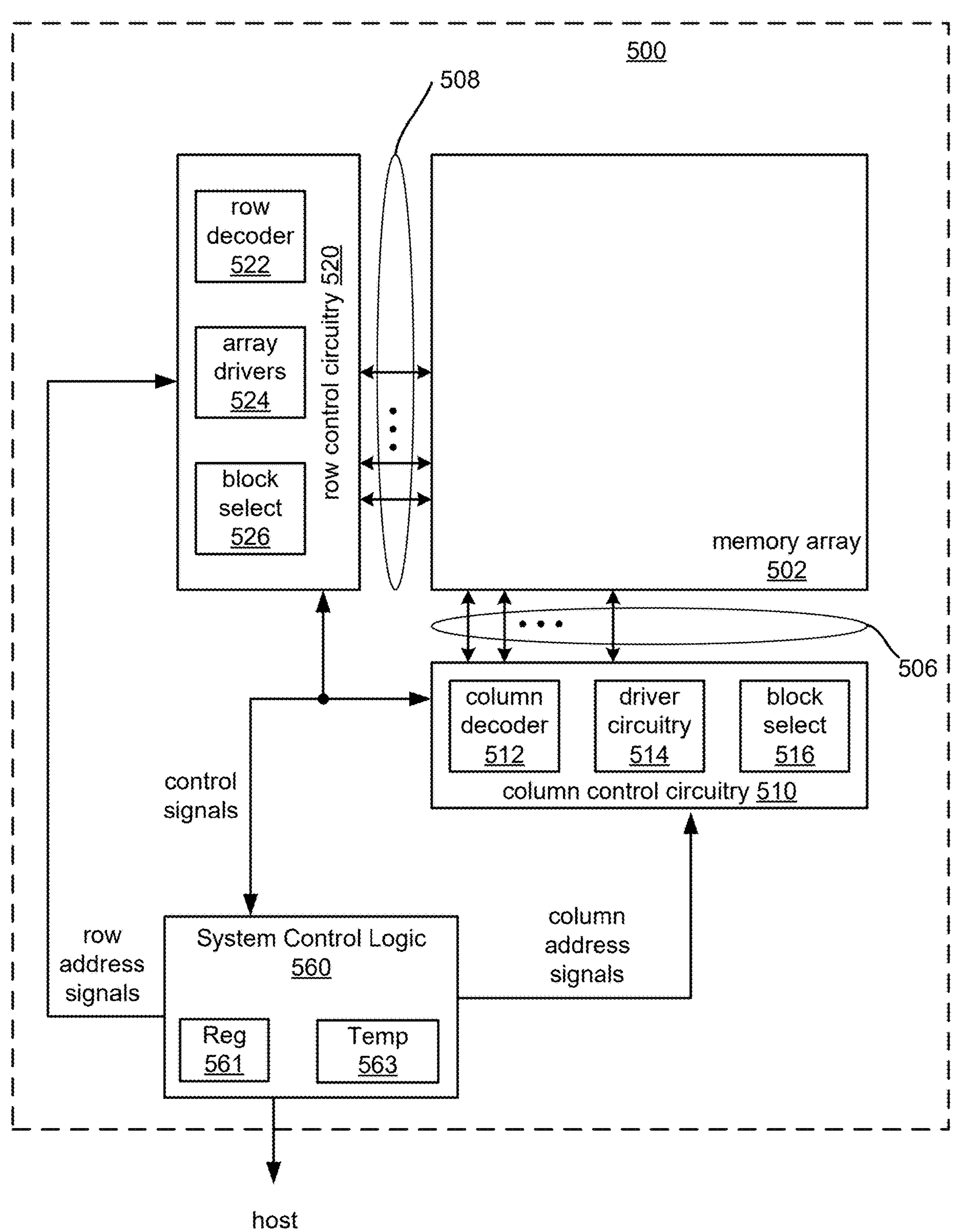
FIG. 5 is a block diagram of one embodiment of a memory die.

FIG. 5 is a block diagram that depicts one example of a memory system 500 that can implement the technology described herein. Memory system 500 includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory system 500 includes row control circuitry 520, whose outputs 508 are connected to respective word lines of the memory array 502. Row control circuitry 520 receives a group of M row address signals and one or more various control signals from system control logic circuit 560, and typically may include such circuits as row decoders 522, array terminal drivers 524 (e.g., word line drivers), and block select circuitry 526 for both reading and writing operations. Memory system 500 also includes column control circuitry 510 whose input/outputs 506 are connected to respective bit lines of the memory array 502. Although only a single block is shown for memory array 502, a memory die can include multiple arrays or "tiles" that can be individually accessed. Column control circuitry 510 receives a group of N column address signals and one or more various control signals from System Control Logic 560, and typically may include such circuits as column decoders 512, array terminal receivers or drivers 514 (e.g., bit line drivers), block select circuitry 516, as well as read/write circuitry, and I/O multiplexers.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine that provides die-level control of memory operations. In one embodiment, the state machine is programmable by software. In other embodiments, the state machine does not use software and is completely implemented in hardware (e.g., electrical circuits). In another embodiment, the state machine is replaced by a micro-controller, with the micro-controller either on or off the memory chip. The system control logic 560 can also include a power control module, which controls the power and voltages supplied to the rows and columns of the memory array 502 during memory operations and may include charge pumps and regulator circuit for creating regulating voltages. System control logic 560 may include one or more state machines, registers and other control logic for controlling the operation of memory system 500. FIG. 5 illustrates such registers at 561, which, for example, can be used to record data such as settings that may be used when accessing (e.g., reading or writing) memory cells of memory array 502. System control logic 560 includes temperature measurement circuit 563 which may have a temperature transducer and may generate temperature measurement values from temperature sensing by the transducer (e.g., from measurement of a current, voltage, resistance or other metric or some combination of metrics). Temperature measurement values obtained by temperature measurement circuit 563 may be sent to other components of system control logic 560 and/or memory system 500, which may use the temperature measurement values (e.g., to adjust certain parameters according to temperature).

In some embodiments, all of the elements of memory system 500, including the system control logic 560, can be formed as part of a single die. In other embodiments, some or all of the system control logic 560 can be formed on a different die.

For purposes of this document, the phrase "one or more control circuits" can include a controller, a state machine, a micro-controller and/or other control circuitry as represented by the system control logic 560 and/or other analogous circuits that are used to control nonvolatile memory.

In one embodiment, memory structure 502 comprises a three dimensional memory array of nonvolatile memory cells in which multiple memory levels are formed above a single substrate, such as a wafer. The memory structure may comprise any type of nonvolatile memory that are monolithically formed in one or more physical levels of memory cells having an active area disposed above a silicon (or other type of) substrate. In one example, the nonvolatile memory cells comprise vertical NAND strings with charge-trapping.

In another embodiment, memory structure 502 comprises a two dimensional memory array of nonvolatile memory cells. In one example, the nonvolatile memory cells are NAND flash memory cells utilizing floating gates. Other types of memory cells (e.g., NOR-type flash memory) can also be used.

The exact type of memory array architecture or memory cell included in memory structure 502 is not limited to the examples above. Many different types of memory array architectures or memory technologies can be used to form memory structure 326. No particular nonvolatile memory technology is required for purposes of the new claimed embodiments proposed herein. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data using magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a programming current pulse. Note that the use of "pulse" in this document does not require a square pulse but includes a (continuous or non-continuous) vibration or burst of sound, current, voltage light, or other wave. Said memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the structure of memory structure 502 of the memory cells and the peripheral circuitry, including all of the other elements. An important characteristic of a memory circuit is its capacity, which can be increased by increasing the area of the memory die of memory system 500 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die for the memory system 500 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 502 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
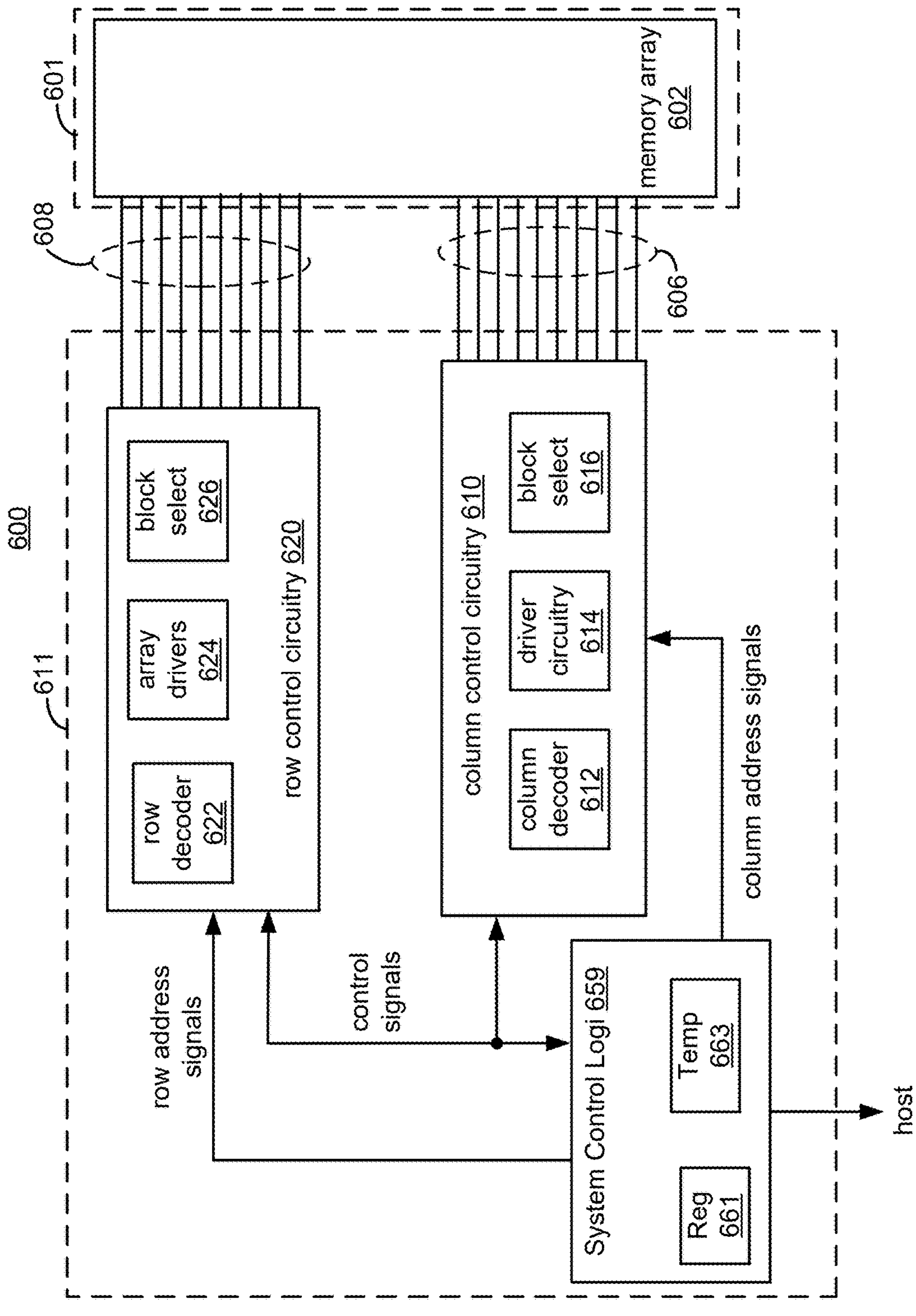
FIGS. 6A and 6B illustrate an example of control circuits on a control die coupled to a memory structure on a memory die.
Figure 6B:
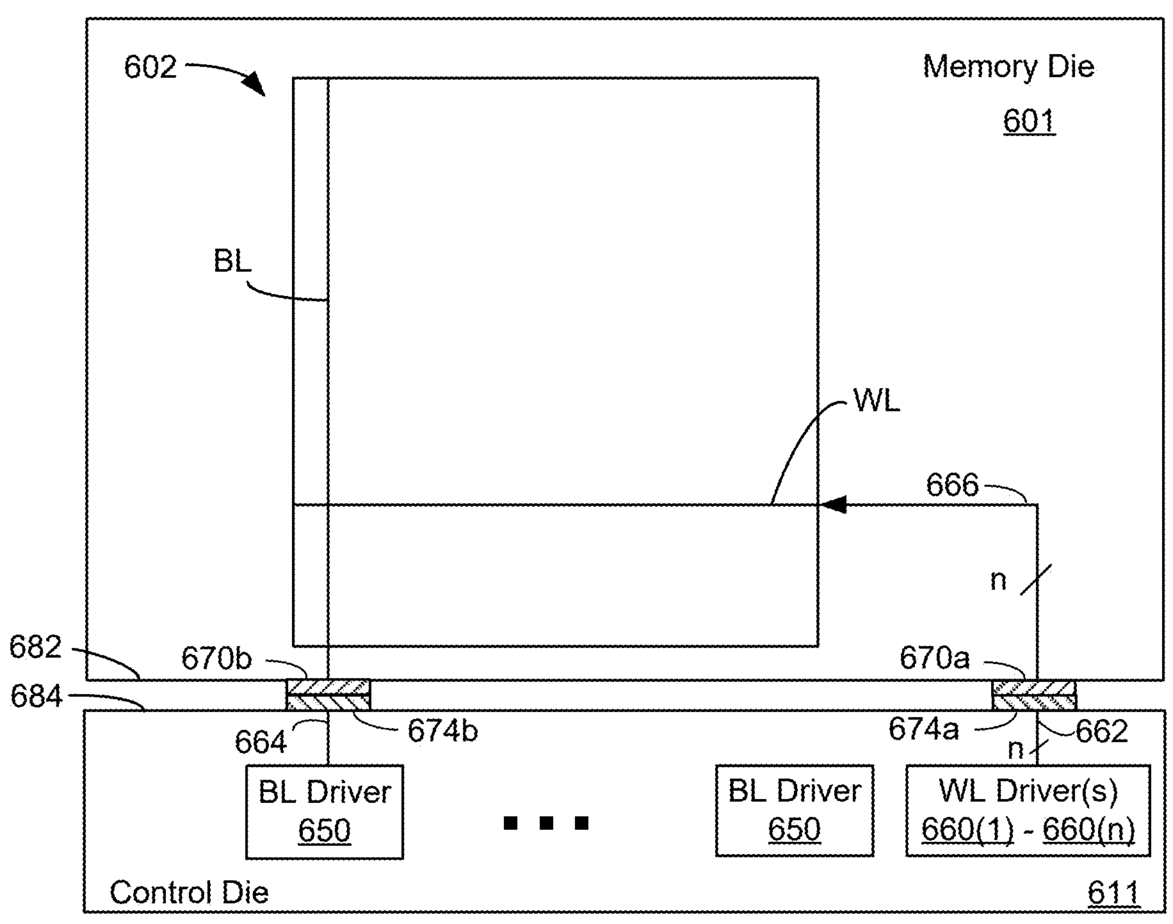

FIGS. 6A and 6B shows an alternative arrangement to that of FIG. 5, which may be implemented using wafer-to-wafer bonding to provide a bonded die pair for integrated memory assembly 600. FIG. 6A shows an example of the peripheral circuitry, including control circuits, formed in a peripheral circuit or control die 611 coupled to memory structure 602 formed in memory die 601. As with 502 of FIG. 5, the memory die 601 can include multiple independently accessible arrays or "tiles". Common components are labelled similarly to FIG. 5 (e.g., 502 is now 602, 510 is now 610, and so on). It can be seen that system control logic 659, row control circuitry 620, and column control circuitry 610 (which may be formed by a CMOS process) are located in control die 611. Additional elements, such as functionalities from controller 102, can also be moved into the control die 611. System control logic 659, row control circuitry 620, and column control circuitry 610 may be formed by a common process (e.g., CMOS process), so that adding elements and functionalities more typically found on a memory controller 102 may require few or no additional process steps (i.e., the same process steps used to fabricate controller 102 may also be used to fabricate system control logic 659, row control circuitry 620, and column control circuitry 610). Thus, while moving such circuits from a die such as memory die of memory system 500 may reduce the number of steps needed to fabricate such a die, adding such circuits to a die such as control die 611 may not require any additional process steps.

FIG. 6A shows column control circuitry 610 on the control die 611 coupled to memory structure 602 on the memory die 601 through electrical paths 606. For example, electrical paths 606 may provide electrical connection between column decoder 612, driver circuitry 614, and block select 616 and bit lines of memory structure 602. Electrical paths may extend from column control circuitry 610 in control die 611 through pads on control die 611 that are bonded to corresponding pads of the memory die 601, which are connected to bit lines of memory structure 602. Each bit line of memory structure 602 may have a corresponding electrical path in electrical paths 606, including a pair of bonded pads, which connects to column control circuitry 610. Similarly, row control circuitry 620, including row decoder 622, array drivers 624, and block select 626, are coupled to memory structure 602 through electrical paths 608. Each electrical path 608 may correspond to a word line, dummy word line, or select gate line. Additional electrical paths may also be provided between control die 611 and memory die 601.

FIG. 6B is a block diagram showing more detail on the arrangement of one embodiment of the integrated memory assembly 600 formed by a bonded die pair. Memory die 601 contains memory structure 602 of memory cells. The memory die 601 may have additional arrays (e.g., multiple modules, each including an array). One representative bit line (BL) and representative word line (WL) 666 are depicted for memory structure 602. There may be thousands or tens of thousands of such bit lines per each memory structure 602. In one embodiment, an array represents a group of connected memory cells that share a common set of unbroken word lines and unbroken bit lines.

Control die 611 includes a number of bit line drivers 650. Each bit line driver 650 is connected to one bit line or may be connected to multiple bit lines in some embodiments. The control die 611 includes a number of word line drivers 660(1)-660(*n*). The word line drivers 660 are configured to provide voltages to word lines. In this example, there are "n" word lines per array or plane. If the memory operation is a program or read, one word line within the selected block is selected for the memory operation, in one embodiment. If the memory operation is an erase, all of the word lines within the selected block are selected for the erase, in one embodiment. The word line drivers 660 provide voltages to the word lines in memory die 601. As discussed above with respect to FIG. 6A, the control die 611 may also include charge pumps, voltage generators, and the like that are not represented in FIG. 6B, which may be used to provide voltages for the word line drivers 660 and/or the bit line drivers 650.

The memory die 601 has a number of bond pads 670*a*, 670*b* on a first major surface 682 of memory die 601. There may be "n" bond pads 670*a*, to receive voltages from a corresponding "n" word line drivers 660(1)-660(*n*). There may be one bond pad 670*b* for each bit line associated with memory structure 602. The reference numeral 670 will be used to refer in general to bond pads on major surface 682.

The control die 611 has a number of bond pads 674*a*, 674*b* on a first major surface 684 of control die 611. There may be "n" bond pads 674*a*, to deliver voltages from a corresponding "n" word line drivers 660(1)-660(*n*) to memory die 601. There may be one bond pad 674*b* for each bit line associated with memory structure 602. The reference numeral 674 will be used to refer in general to bond pads on major surface 682. Note that there may be bond pad pairs 670*a*/674*a* and bond pad pairs 670*b*/674*b*. In some embodiments, bond pads 670 and/or 674 are flip-chip bond pads.

Relative to FIG. 5, the on-die control circuits of FIG. 6A can include addition functionalities within its logic elements, both more general capabilities than are typically found in the memory controller 102 and some CPU capabilities, but also application specific features.

In the following, system control logic 560/660, column control circuitry 510/610, row control circuitry 520/620, and/or controller 102 (or equivalently functioned circuits), in combination with all or a subset of the other circuits depicted in FIG. 5 or on the control die 611 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory array 502/602 of FIGS. 5 and 6A will mainly be discussed in the context of a cross-point architecture, although much of the discussion can be applied more generally. The following discussion will mainly focus on embodiments based on a cross-point architecture using MRAM memory cells, although much of the discussion can be applied more generally to nonvolatile memory cells.

Figure 7A:
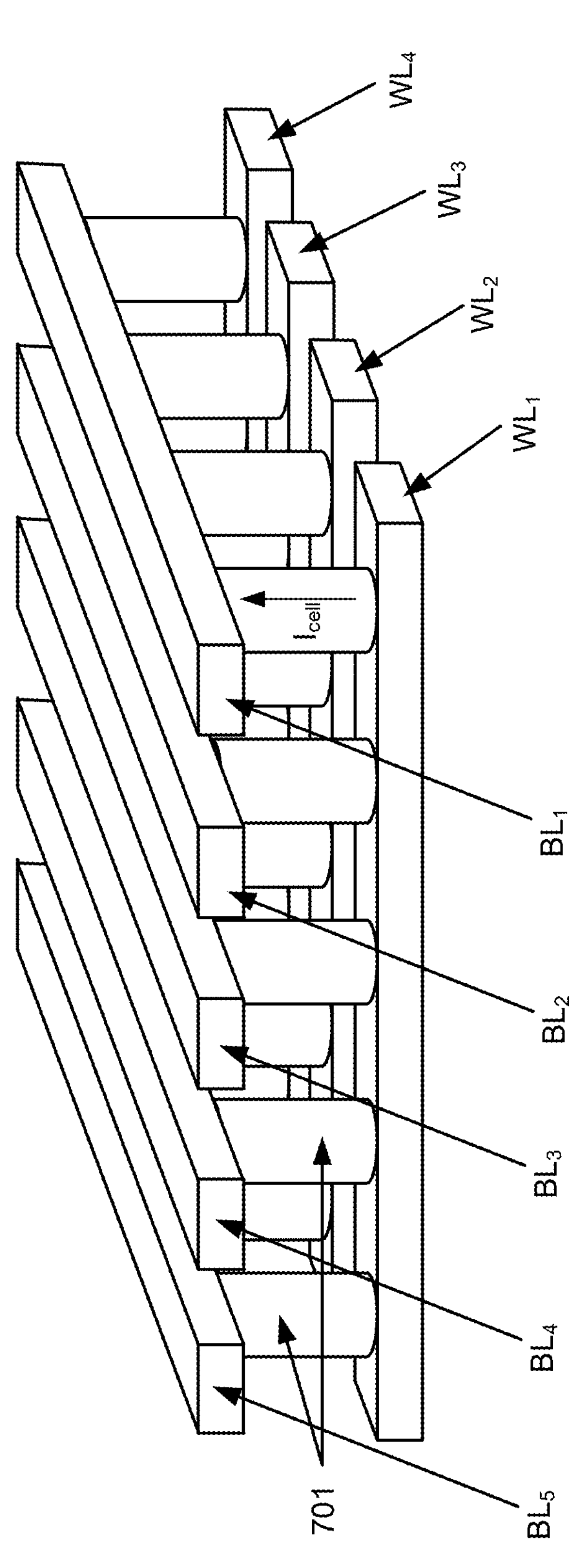
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502/602 of FIG. 7A is one example of an implementation for memory array 502 in FIG. 5 or 602 in FIG. 6A, where a memory die can include multiple such array structures. The bit lines $BL_1$-$BL_5$ are arranged in a first direction (e.g., "bit line direction" represented as running into the page) relative to an underlying substrate (not shown) of the die and the word lines $WL_1$-$WL_5$ are arranged in a second direction (e.g., "word line direction") perpendicular to the first direction (across the page). FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502/602 includes a plurality of memory cells 701. The memory cells 701 may include re-writeable memory cells, such as can be implemented using ReRAM, MRAM, PCM, FeRAM, or other material with a programmable resistance. The current in the memory cells of the first memory level is shown as flowing upward as indicated by arrow $I_{cell}$, but current can flow in either direction, as is discussed in more detail in the following.

Figure 7B:
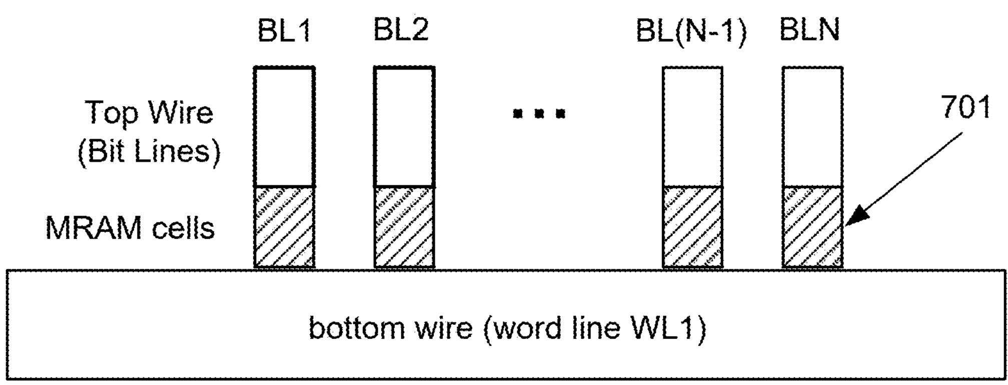
FIGS. 7B and 7C respectively present side and top views of the cross-point structure in FIG. 7A.
Figure 7C:
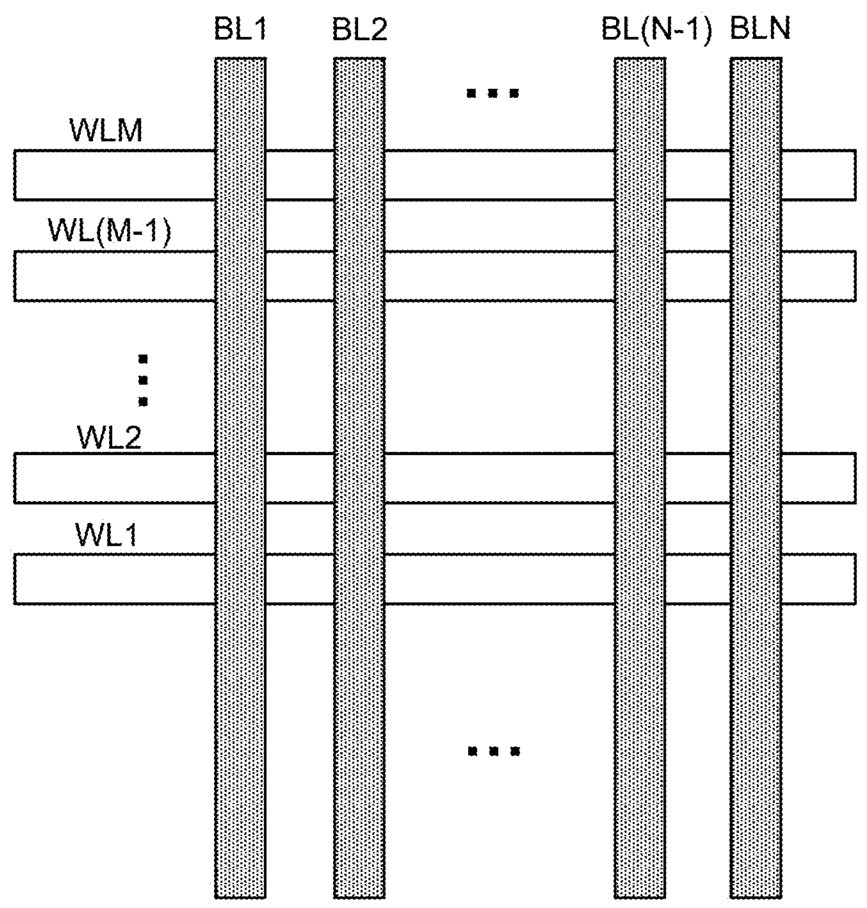

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell, although PCM, FeRAM, ReRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their programming are given below.

The cross-point array of FIG. 7A illustrates an embodiment with one layer (one story) of word lines and bits lines, with the MRAM or other memory cells sited at the intersection of the two sets of conducting lines. To increase the storage density of a memory die, multiple layers (stories) of such memory cells and conductive lines can be formed. A 2-layer (2-story) example is illustrated in FIG. 7D.

Figure 7D:
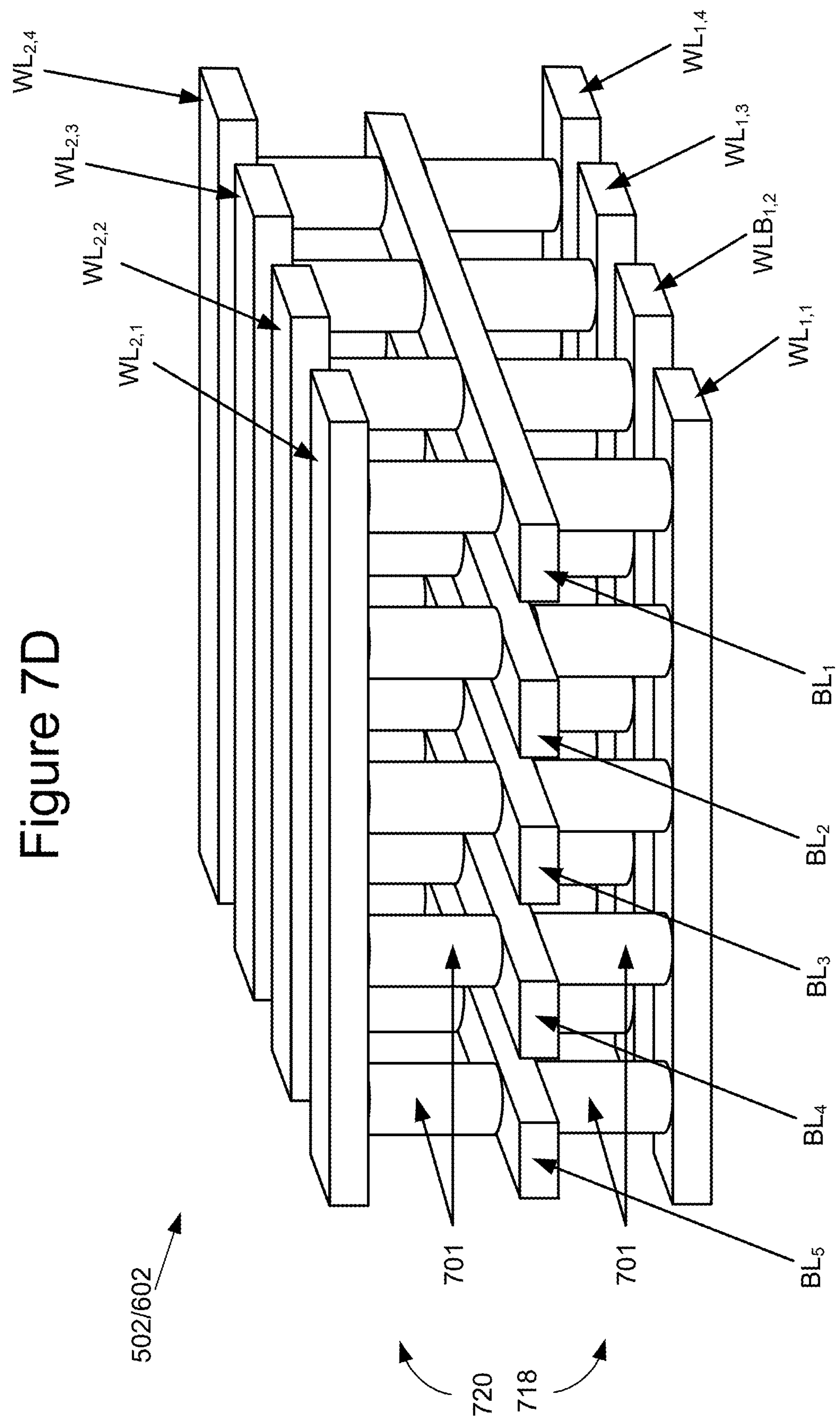
FIG. 7D depicts an embodiment of a portion of a two level memory array that forms a cross-point architecture in an oblique view.

FIG. 7D depicts an embodiment of a portion of a two level (two story) memory array that forms a cross-point architecture in an oblique view. As in FIG. 7A, FIG. 7D shows a first layer 718 (first story) of memory cells 701 of an array 502/602 connected at the cross-points of the first layer of word lines $WL_{1,1}$-$WL_{1,4}$ and bit lines $BL_1$-$BL_5$. A second layer (second story) of memory cells 720 is formed above the bit lines $BL_1$-$BL_5$ and between these bit lines and a second set of word lines $WL_{2,1}$-$WL_{2,4}$. Although FIG. 7D shows two layers (stories), 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around. The two layers can be structured to have current flow in the same direction in each layer for a given operation, e.g. from bit line to word line for read, or to have current flow in the opposite directions, e.g. from word line to bit line for layer 1 read and from bit line to word line for layer 2 read.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used as the memory die 292 of FIG. 4, to replace local memory 106, or both.

Figure 8:
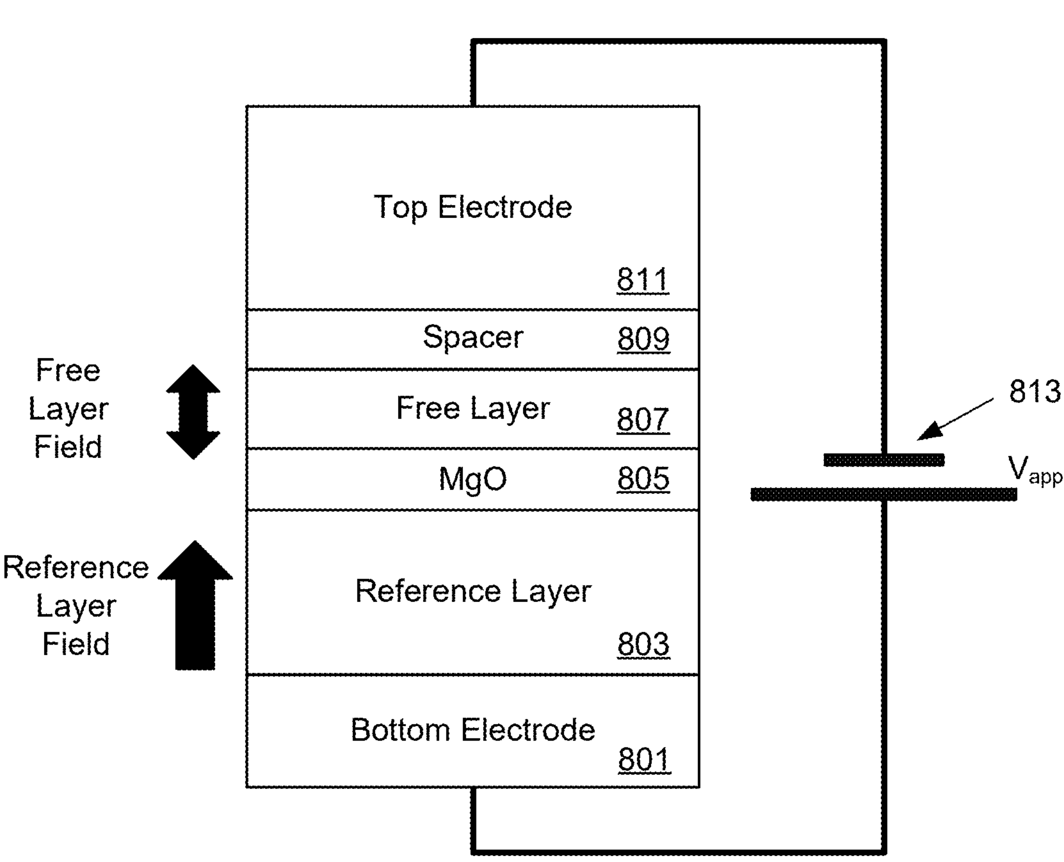
FIG. 8 illustrates an embodiment for the structure of an MRAM memory cell.

FIG. 8 illustrates an embodiment for the structure of an MRAM memory cell. A voltage being applied across the memory cell, between the memory cell's corresponding word line and bit line, is represented as a voltage source $V_{app}$ 813. The memory cell includes a bottom electrode 801, a pair of magnetic layers (reference layer 803 and free layer 807) separated by a separation or tunneling layer of, in this example, magnesium oxide (MgO) 805, and then a top electrode 811 separated from the free layer 807 by a spacer 809. The state of the memory cell is based on the relative orientation of the magnetizations of the reference layer 803 and the free layer 807: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 803 is fixed and, in the example of FIG. 15, is oriented upward. Reference layer 803 is also known as a fixed layer or pinned layer.

Data is written to an MRAM memory cell by programming the free layer 807 to either have the same orientation or opposite orientation. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

FIG. 9 illustrates an embodiment for an MRAM memory cell design as it would be implemented in a cross-point array in more detail. When placed in a cross-point array, the top and bottom electrodes of the MRAM memory cells will be two of the adjacent layers of wires of the array, for example the top and bottom wires of the two level or two deck array. In the embodiment shown here, the bottom electrode is the word line 901 and the top electrode is the bit line 911 of the memory cell, but these can be reversed in some embodiments by reversing the orientation of the memory element. Between the word line 901 and bit line 911 are the reference layer 903 and free layer 907, which are again separated MgO barrier 905. In the embodiment shown in FIG. 9, a MgO cap 908 is also formed on top of the free layer 907 and a conductive spacer 909 is formed between the bit line 911 and the MgO cap 908. The reference layer 903 is separated from the word line 901 by another conductive spacer 902. On either side of the memory cell structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer 907, embodiments include CoFe or CoFeB Alloy with a thickness on the order ~1-2 nm, where an Ir layer can be interspersed in the free layer close to MgO barrier 905 and the free layer 907 can be doped with Ta, W, or Mo. Embodiments for the reference layer 903 can include a bilayer of CoFeB and CoPt multilayer coupled with an Ir or Ru spacer 902. The MgO cap 908 is optional, but can be used to increase anisotropy of free layer 907. The conductive spacers can be conductive metals such as Ta, W, Ru, CN, TiN, and TaN, among others.

To sense a data state stored in an MRAM, a voltage is applied across the memory cell as represented by $V_{app}$ to determine its resistance state. For reading an MRAM memory cell, the voltage differential $V_{app}$ can be applied in either direction; however, MRAM memory cells have a directionality and, because of this, in some circumstances there is a preference for reading in one direction over the other. For example, the optimum current amplitude to write a bit into the AP (high resistance state, HRS) may be greater than that to write to the P (low resistance state) by 50% or more, so bit error rate (read disturb) is less probable if reading to AP (2AP). Some of these circumstances and the resultant directionality of a read are discussed below. The directionality of the biasing particularly enters into some embodiments for the programming of MRAM memory cells, as is discussed further with respect to FIGS. 10A and 10B.

Figure 10A:
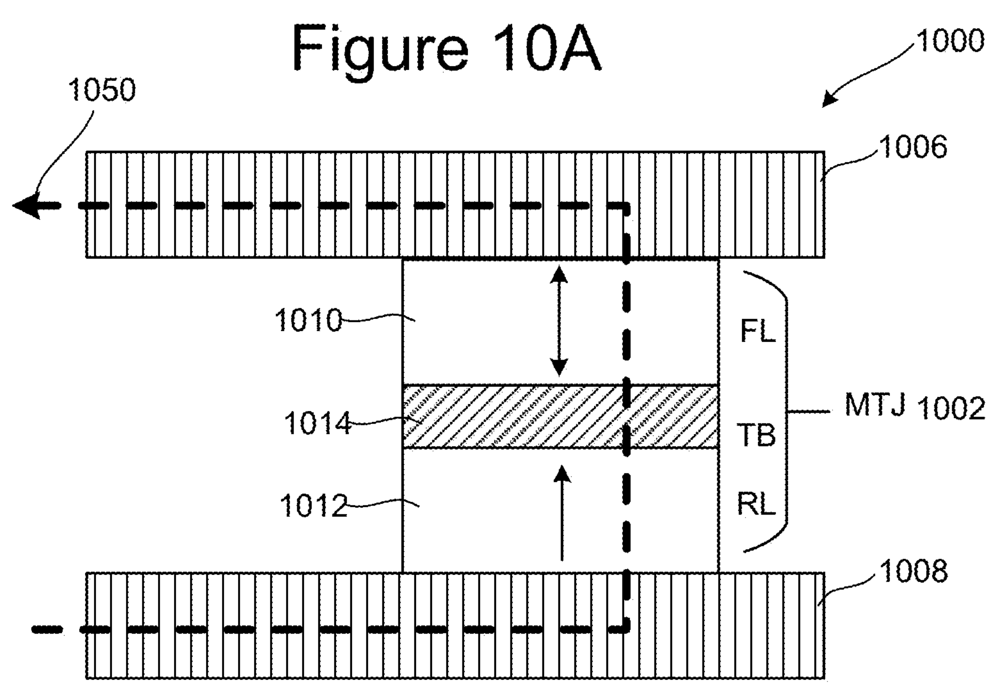
FIGS. 10A and 10B illustrate the writing of an MRAM memory cell by use of a spin torque transfer (STT) mechanism.
Figure 10B:
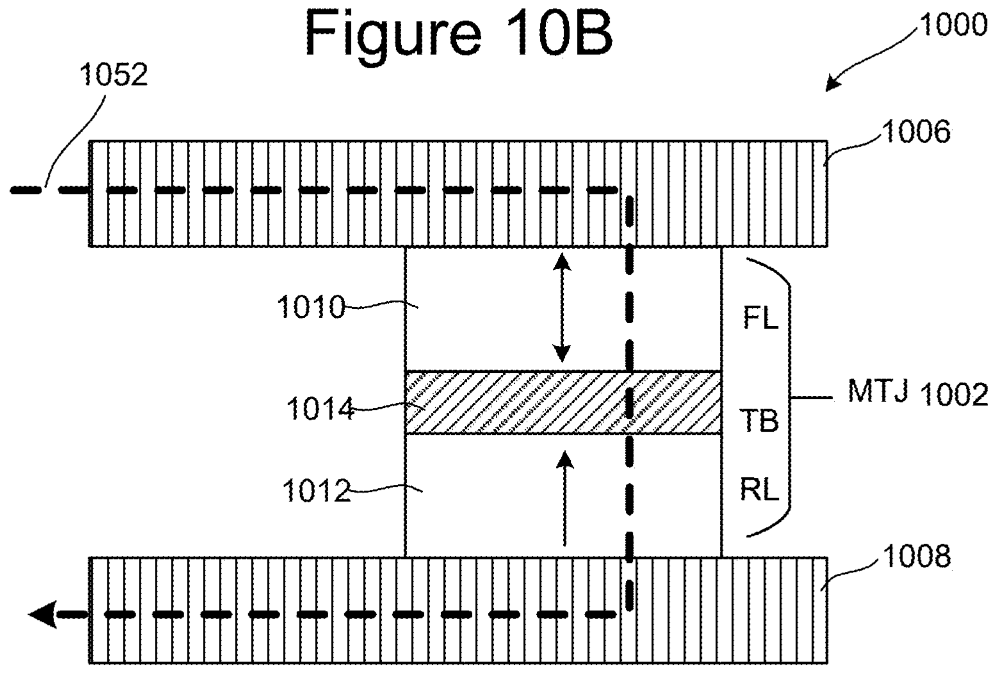

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is directed into a second magnetic layer (the free layer), angular momentum can be transferred to this second magnetic layer, changing the direction of magnetization of the second magnetic layer. This is referred to as spin transfer torque. FIGS. 10A and 10B illustrate the use of spin transfer torque to program or write to MRAM memory. Spin transfer torque magnetic random access memory (STT MRAM) has the advantages of lower power consumption and better scalability over MRAM variations such as toggle MRAM. Compared to other MRAM implementations, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms of electron behavior, FIGS. 10A and 10B and their discussion are given in terms of electron current, where the direction of the write current is defined as the direction of the electron flow. Therefore, the term write current in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing of an MRAM memory cell using the STT mechanism, depicting a simplified schematic representation of an example of an STT-switching MRAM memory cell 1000 in which both the reference and free layer magnetization are in the perpendicular direction. Memory cell 1000 includes a magnetic tunnel junction (MTJ) 1002 comprising an upper ferromagnetic layer 1010, a lower ferromagnetic layer 1012, and a tunnel barrier 1014 (TB) as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RL and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000. In this regard, electrical conductors 1006/1008 attached to memory cell 1000 are utilized to read the MRAM data. By design, both the parallel and antiparallel configurations remain stable in the quiescent state and/or during a read operation (at sufficiently low read current).

For both the reference layer RL 1012 and free layer FL 1010, the direction of magnetization is in a perpendicular direction (i.e. perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is again perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron write current 1050 is applied from conductor 1008 to conductor 1006, as depicted in FIG. 10A. To generate the electron write current 1050, the top conductor 1006 is place at a higher voltage level than bottom conductor 1008, due to the negative charge of the electron. The electrons in the electron write current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron write current is turned off.

In contrast, if free layer 1010 and reference layer 1012 magnetizations are initially parallel, the direction of magnetization of free layer 1010 can be switched to become antiparallel to the reference layer 1012 by application of an electron write current of opposite direction to the aforementioned case. For example, electron write current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron write current direction (polarity).

The data ("0" or "1") in memory cell 1000 can be read by measuring the resistance of the memory cell 1000. Low resistance typically represents a "0" bit and high resistance typically represents a "1" bit, although sometimes the alternate convention occurs. A read current can being applied across the memory cell (e.g., across the magnetic tunnel junction 1002) by applying an electron read current from conductor 1008 to conductor 1006, flowing as shown for 1050 in FIG. 10A (the "AP2P direction"); alternatively, the electron read current can be applied from conductor 1006 to conductor 1008, flowing as shown for 1052 in FIG. 10B (the "P2AP direction"). In a read operation, if the electron write current is too high, this can disturb data stored in a memory cell and change its state. For example, if electron read current uses the P2AP direction of FIG. 10B, too high of a current or voltage level can switch any memory cells in the low resistance P state into the high resistance AP state. Consequently, although the MRAM memory cell can be read in either direction, the directional nature of the write operation may make one read direction preferable over the other in various embodiments as the P2AP direction since more current is required to write the bit in that direction.

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding to a selected memory cell are biased to place a voltage across the selected memory cell and induce the flow of electrons as illustrated with respect to FIG. 10A or 10B. This will also apply a voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array.

One approach to address this unwanted current leakage is to place a selector element in series with each MRAM or other resistive (e.g., ReRAM, PCM, and FeRAM) memory cell. For example, a select transistor can be placed in series with each resistive memory cell element in FIGS. 7A-7D so that memory cells 701 are now a composite of a selector and a programmable resistance. Use of a transistor, however, requires the introduction of additional control lines to be able to turn on the corresponding transistor of a selected memory cell. Additionally, transistors will often not scale in the same manner as the resistive memory element, so that as memory arrays move to smaller sizes the use of transistor based selectors can be a limiting factor.

An alternate approach to selector elements is the use of a threshold switching selector device in series with the programmable resistive element. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current, or the voltage is lowered below a holding voltage. When this occurs, the threshold switching selector returns to the off state. Accordingly, to program a memory cell at a cross-point, a voltage or current is applied which is sufficient to turn on the associated threshold switching selector and set or reset the memory cell; and to read a memory cell, the threshold switching selector similarly must be activated by being turned on before the resistance state of the memory cell can be determined. One set of examples for a threshold switching selector is an ovonic threshold switching material of an Ovonic Threshold Switch (OTS).

Figure 11A:
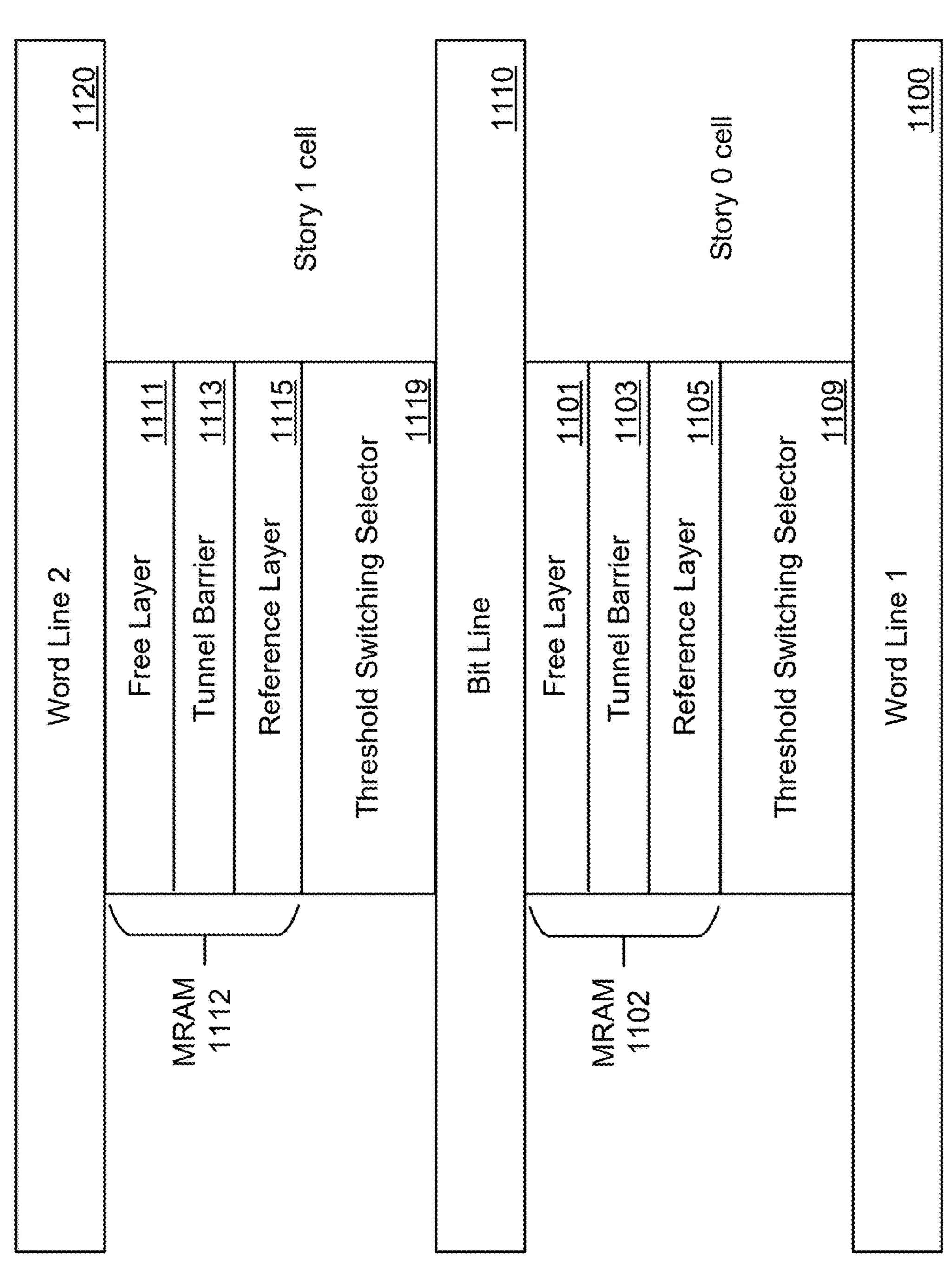
FIGS. 11A and 11B illustrate embodiments for the incorporation of threshold switching selectors into an MRAM memory array having a cross-point architecture.
Figure 11B:
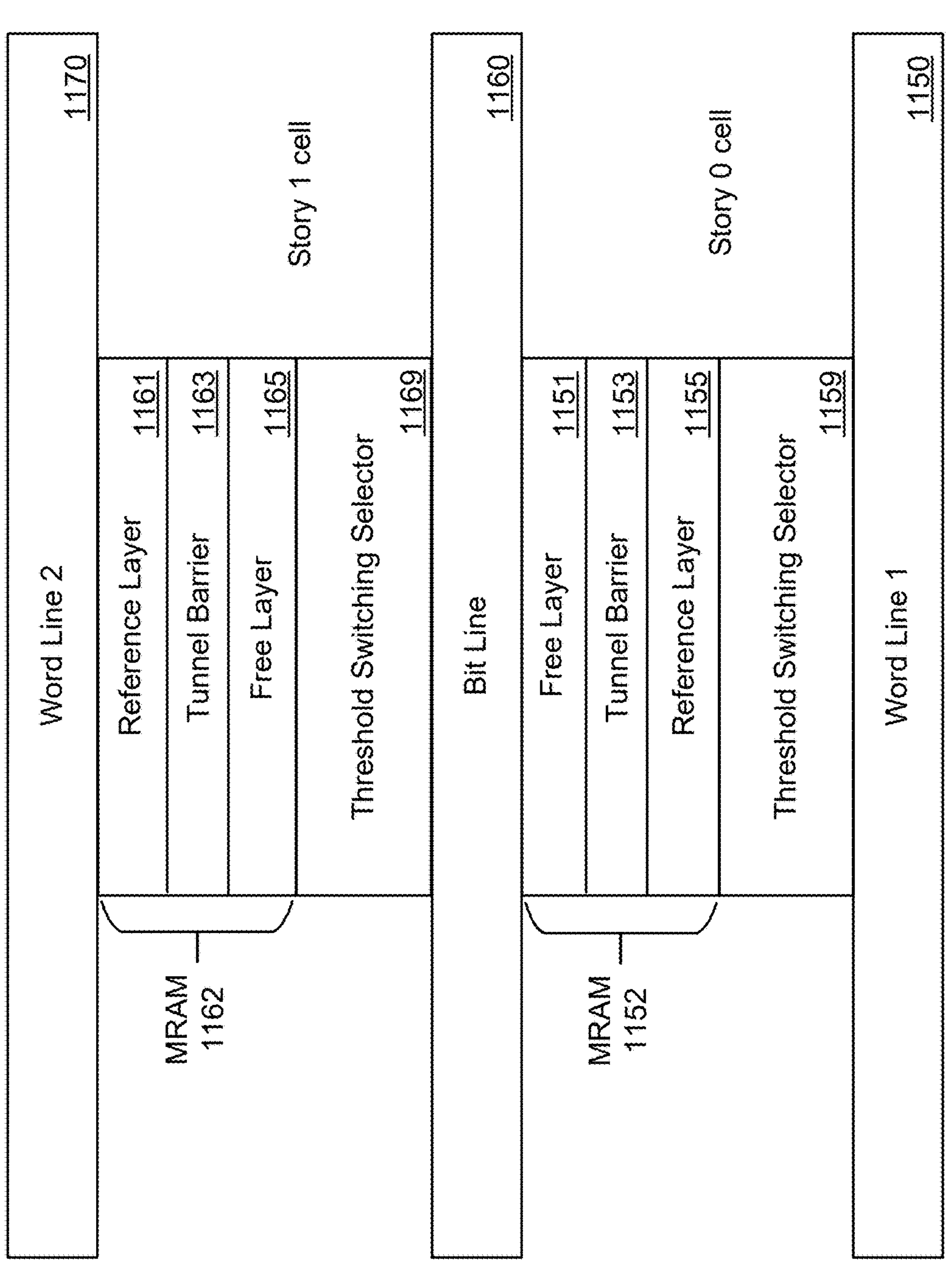

FIGS. 11A and 11B illustrate embodiments for the incorporation of threshold switching selectors into an MRAM memory array having a cross-point architecture. The examples of FIGS. 11A and 11B show two MRAM cells in a two layer (2-story) cross-point array, such as shown in FIG. 7D, but in a side view. FIGS. 11A and 11B show a lower first conducting line of word line 1 1100, an upper first conducting line of word line 2 1120, and an intermediate second conducting line of bit line 1110. In these figures, all of these lines are shown running left to right across the page for ease of presentation, by in a cross-point array they would be more accurately represented as represented in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM device 1102 including free layer 1101, tunnel barrier 1103, and reference layer 1105 is formed above the threshold switching selector 1109, where this series combination of the MRAM device 1102 and the threshold switching selector 1109 together form the Story 0 cell between the bit line 1110 and word line 1 1100. The series combination of the MRAM device 1102 and the threshold switching selector 1109 operate largely as described above with respect to FIGS. 10A and 10B when the threshold switching selector 1109 is turned on, aside from some voltage drop across the threshold switching selector 1109. Initially, though, the threshold switching selector 1109 needs to be turned on by applying a voltage above the threshold voltage $V_{th}$ of the threshold switching selector 1109, and then the biasing current or voltage needs to be maintained high enough above the holding current or holding voltage of the threshold switching selector 1109 so that it stays on during the subsequent read or write operation.

In Story 1, an MRAM device 1112 includes free layer 1111, tunnel barrier 1113, and reference layer 1115 is formed above the threshold switching selector 1119, with the series combination of the MRAM device 1112 and the threshold switching selector 1119 together forming the Story 1 cell between the bit line 1110 and word line 2 1120. The Story 1 cell will operate as for the Story 0 cell, although the lower conductor now corresponds to a bit line 1110 and the upper conductor is now a word line, word line 2 1120.

In the embodiment of FIG. 11A, the threshold switching selector 1109/1119 is formed below the MRAM device 1102/1112, but in alternate embodiments the threshold switching selector can be formed above the MRAM device for one or both layers. As discussed with respect to FIGS. 10A and 10B, the MRAM memory cell is directional. In FIG. 11A, the MRAM devices 1102 and 1112 have the same orientation, with the free layer 1101/1111 above (relative to the unshown substrate) the reference layer 1105/1115. Forming the stories between the conductive lines with the same structure can have a number of advantages, particularly with respect to processing as each of the two stories, as well as subsequent stories in embodiments with more stories, can be formed according to the same processing sequence.

FIG. 11B illustrates an alternate embodiment that is arranged similarly to that of FIG. 11A, except that in the Story 1 cell the locations of the reference layer and free layer are reversed. More specifically, between word line 1 1150 and bit line 1160, as in FIG. 11A the Story 0 cell includes an MRAM structure 1152 having a free layer 1151 formed over tunnel barrier 1153, that is turn formed over the reference layer 1155, with the MRAM structure 1152 formed over the threshold switching selector 1159. The upper story, Story 1, of the embodiment of FIG. 11B again has an MRAM device 1162 formed over a threshold switching selector 1169 between the bit line 1160 and word line 2 1170, but, relative to FIG. 11A, with the MRAM device 1162 inverted, having the reference layer 1161 now formed above the tunnel barrier 1163 and the free layer 1165 now under the tunnel barrier 1163.

Although the embodiment of FIG. 11B requires a different processing sequence for the forming of layers, in some embodiments it can have advantages. In particular, the directionality of the MRAM structure can make the embodiment of FIG. 11B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line 1160 will be biased such as in the P2AP direction, the bit line 1160 is biased low (e.g., 0V) for both the upper and lower cell, with word line 1 1150 and word line 2 1170 both biased to a higher voltage level. Similarly, with respect to writing, for writing to the high resistance AP state the bit line 1160 is biased low (e.g., 0V) for both the upper and lower cell, with word line 1 1150 and word line 2 1170 both biased to a higher voltage level; and for writing to the low resistance P state the bit line 1160 is biased to the high voltage level, with word line 1 1150 and word line 2 1170 both biased to the low voltage level. In contrast, for the embodiment of FIG. 11A, the bit lines and word lines would need to have their bias levels reversed for performing any of these operations on the upper level relative to the lower level.

To either read data from or write data to an MRAM memory cell involves passing a current through the memory cell. In embodiments where a threshold switching selector is placed in series with the MRAM device, before the current can pass through the MRAM device the threshold switching selector needs to be turned on by applying a sufficient voltage across the series combination of the threshold switching selector and the MRAM device.

Figure 12:
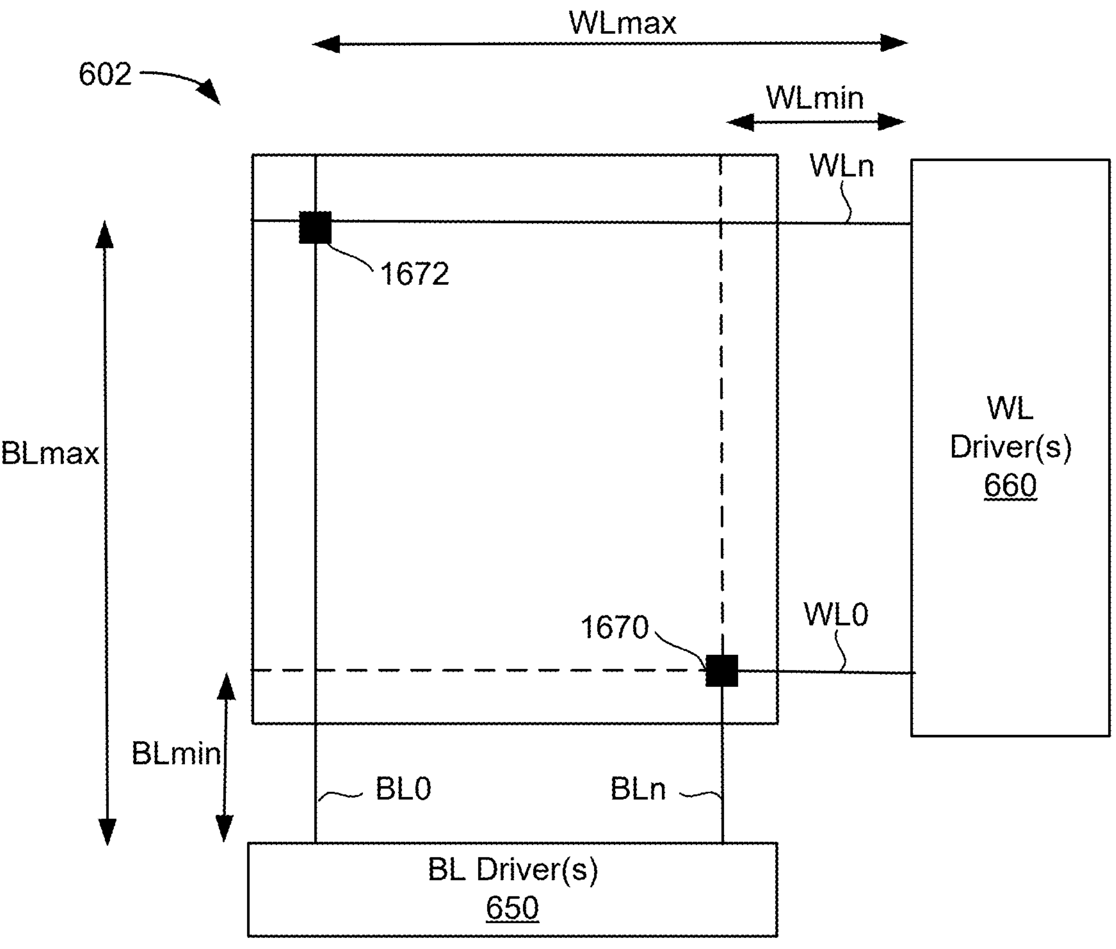
FIG. 12 shows an example of a memory structure that includes nonvolatile memory cells connected by word lines and bit lines of different lengths.

FIG. 12 illustrates an example of memory structure 602 with corresponding word line driver(s) 660 and bit line driver(s) 650 (word line drivers 660 and bit line drivers 650 may be on a memory die with memory structure 602 or on a separate die that is connected to the memory die containing memory structure 602). Two bit lines, BL0 and BLn, and two word lines, WL0 and WLn are illustrated along with first memory cell 1670 and second memory cell 1672 (additional lines and memory cells are omitted for clarity). First memory cell 1670 (near memory cell) is relatively near to both word line driver(s) 660 and bit line driver(s) 650. First memory cell 1670 is connected to bit line driver(s) 650 by BLn, with an effective bit line length of BLmin, and is connected to word line driver(s) 660 by WL0, with an effective word line length of WLmin. This gives a combined electrical distance (effective word line and bit line lengths combined) of BLmin+WLmin. Second memory cell 1672 (far memory cell) is relatively far from both word line driver(s) 660 and bit line driver(s) 650. Second memory cell 1672 is connected to bit line driver(s) 650 by BL0, with an effective bit line length of BLmax, and is connected to word line driver(s) 660 by WLn, with an effective word line length of WLmax. This gives a combined electrical distance (effective word line and bit line lengths combined) of BLmax+WLmax.

The resistance of an electrical conductor such as a word line or bit line, which may be considered to be substantially uniform in cross-section, depends on the length of the conductor and may increase linearly with length (e.g., resistance per unit length may be considered uniform so that total resistance is proportional to length). Because of the different electrical distances and their associated resistances, memory access operations (e.g., write operations including set and/or reset operations) directed to first memory cell 1670 and second memory cell 1672 may have different results. For example, non-uniform resistance of word lines and bit lines may result in non-uniform series resistance and non-uniform memory access currents (e.g., write current used for set and/or reset), which may result in non-uniform programming and a higher error rate than if memory access currents were more uniform.

First memory cell 1670 and second memory cell 1672 represent cases at either end of a range of possible electrical distances for memory cells of memory structure 602 to bit line and word line drivers (e.g., BLmin and BLmax may be the minimum and maximum bit line distances respectively while WLmin and WLmax may be the minimum and maximum word line distances respectively in memory structure 602). Other memory cells may have electrical distances somewhere within this range, with corresponding word line and bit line distances and resistances that are between those of first memory cell 1670 and second memory cell 1672, which may result in series resistances between those of first memory cell 1670 and second memory cell 1672. The word line and bit line resistances associated with accessing different memory cells may be predictable based on the cells' respective locations in a memory structure (e.g., based on respective distances to word line and bit line drivers).

While FIG. 12 shows an example of WL and BL drivers connected at ends of word lines and bit lines respectively, the present technology is not limited to any particular arrangement of lines and respective driver circuits.

Figure 13A:
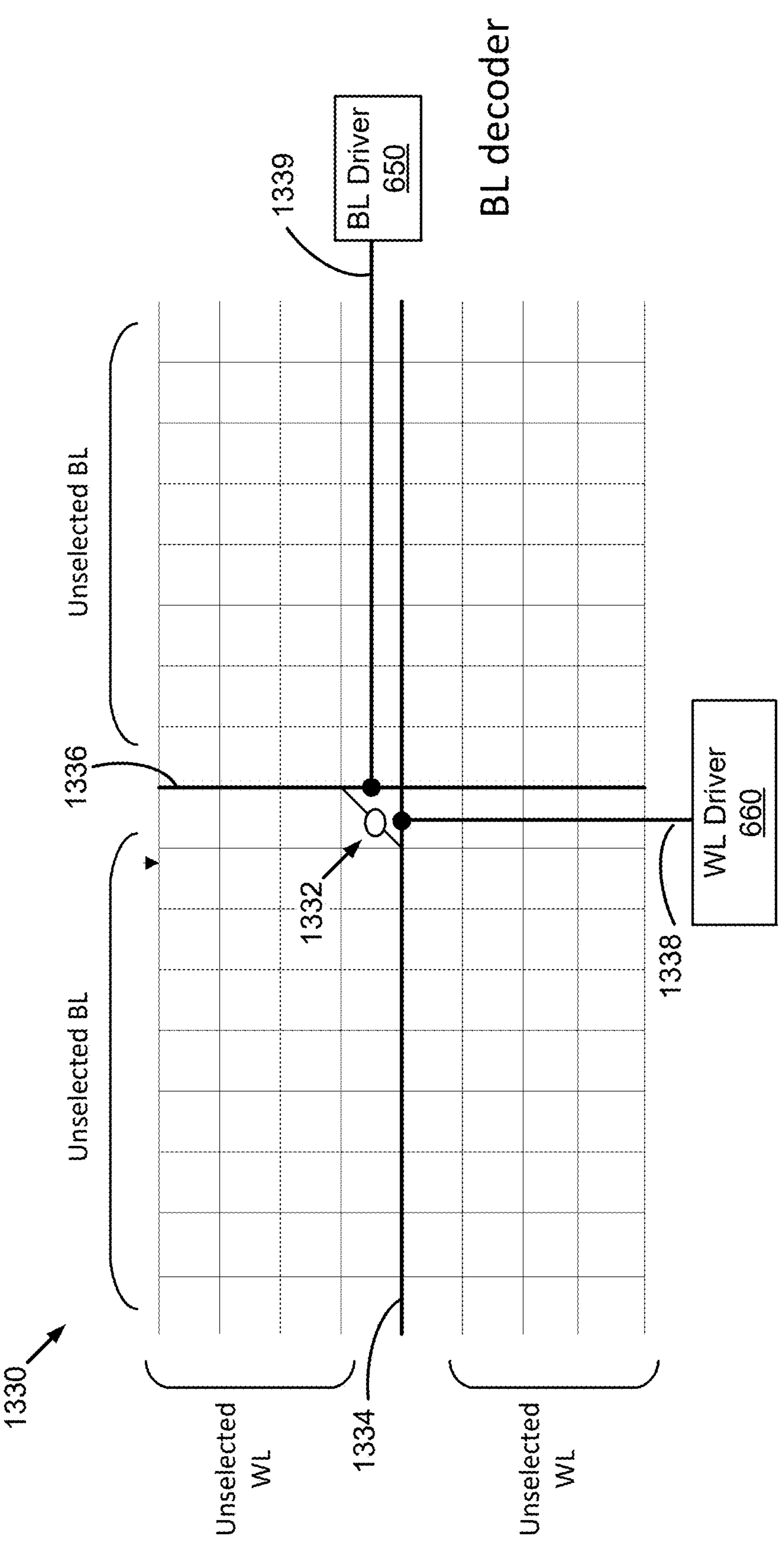
FIGS. 13A-B show examples of nonvolatile memory cells connected by word lines and bit lines of different lengths.
Figure 13B:
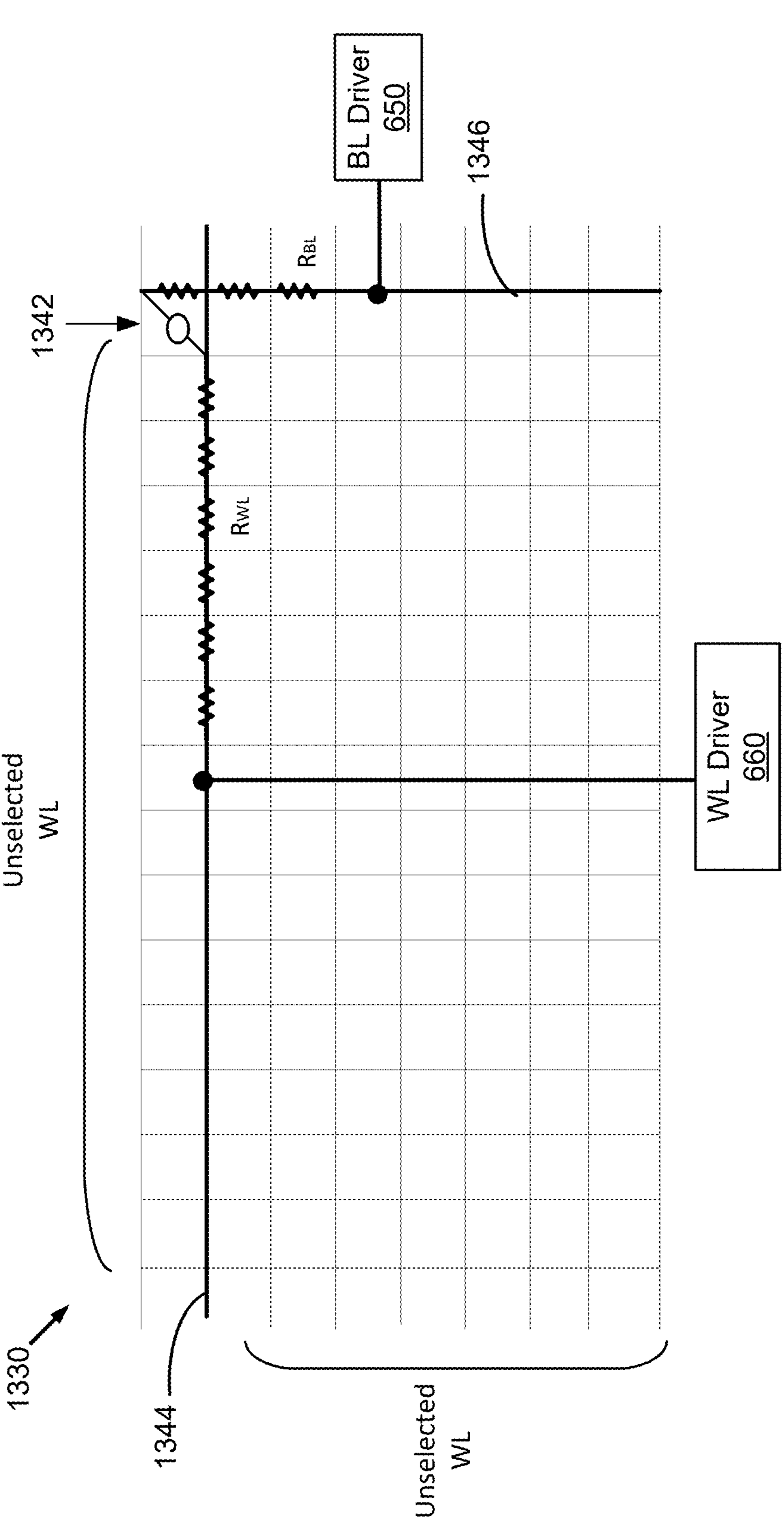

FIGS. 13A-B illustrated an example of a portion of a cross-point MRAM structure 1330 in which connections to lines are formed at or near their midpoints. For example, FIG. 13A shows a selected memory cell 1332, which is connected between a selected word line 1334 and a selected bit line 1336. FIG. 13A shows WL Driver 660 connected at a midpoint of selected WL 1334 and shows BL Driver 650 connected at a midpoint of selected BL 1336. Because selected memory cell 1332 is located close to the midpoints of selected WL 1334 and selected BL 1336, at or near connection to respective WL and BL drivers, series resistance of selected WL 1334 and selected BL 1336 may be small (e.g., zero or near-zero) when accessing selected memory cell 1332. In general, conductive lines between drivers and word or bit lines (e.g., conductive lines 1338 and 1339) have relatively large cross-sectional area (e.g., thicker and/or wider than WLs or BLs) resulting in lower resistance than BL and WL resistance. In some cases, such resistances may be ignored while in other cases such resistances may be considered part of WL resistance and BL resistance respectively.

FIG. 13B shows another selected memory cell 1342, which is connected between a selected word line 1344 and a selected bit line 1346. FIG. 13B shows WL Driver 660 connected at a midpoint of selected WL 1344 and shows BL Driver 650 connected at a midpoint of selected BL 1346. Because selected memory cell 1342 is located relatively far away from midpoints of selected WL 1344 and selected BL 1346, far from connection to respective WL and BL drivers, series resistance of selected WL 1344 ($R_{WL}$) and series resistance of selected BL 1346 ($R_{BL}$) may be significant when accessing selected memory cell 1342.

While FIGS. 12-13B show two arrangements for connecting driver circuits to word and bit lines (end connection and mid-point connection), other arrangements are also possible and the present technology is not limited to any particular arrangement. In general, accessing memory cells at different locations in a memory structure may include passing currents through electrical conductors connected in series with selected memory cells (e.g., selected word lines and bit lines) that have different resistances (e.g., depending on the distances from respective driver circuits). Such differing resistances may affect memory access operations including write operations (e.g., MRAM reset operations).

Figures 14A, 14B:
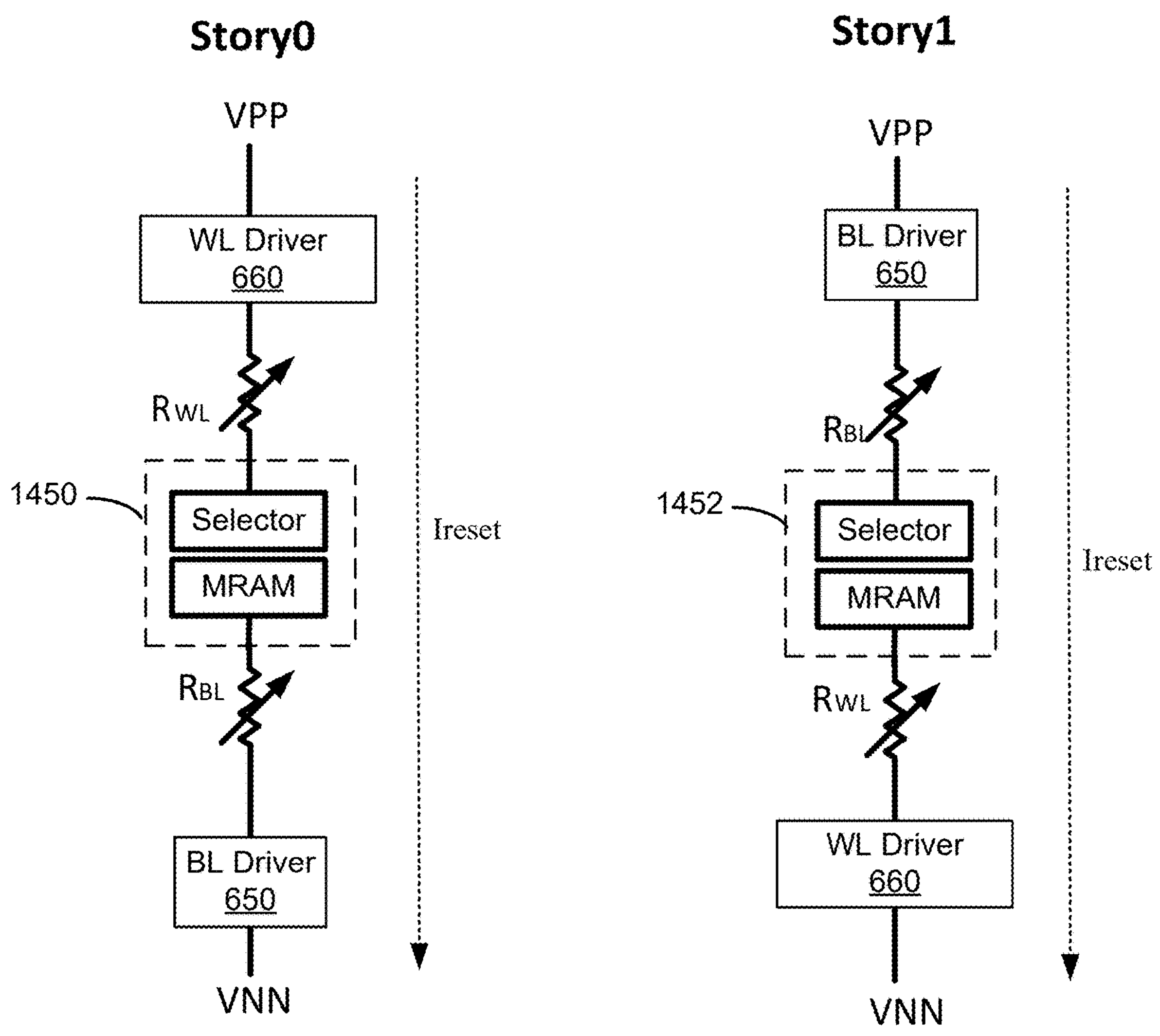
FIGS. 14A-B show schematics of examples of access currents in nonvolatile memory cells.

FIGS. 14A-B show schematic illustrations of current flow through two selected memory cells during a write (reset) operation. FIG. 14A shows selected memory cell 1450 in Story 0 (e.g., Story 0 cell of FIGS. 11A-B) and FIG. 14B shows selected memory cell 1452 in Story 1 (e.g., Story 1 cell of FIGS. 11A-B). In FIG. 14A, WL Driver 660 provides a voltage VPP and BL Driver 650 provides a voltage VNN to cause a reset current Ireset to flow through a selected WL (shown by $R_{WL}$), selected memory cell 1450 and a selected BL (shown by $R_{BL}$). In FIG. 14B, BL Driver 650 provides a voltage VPP and WL Driver 660 provides a voltage VNN to cause a reset current Ireset to flow through a selected BL (shown by $R_{BL}$), selected memory cell 1452 and a selected WL (shown by $R_{WL}$). In both examples, word line resistance, $R_{WL}$, and bit line resistance, $R_{BL}$, are shown schematically as a variable resistors connected in series with the selected memory cell (e.g., connected in series between a WL driver and a BL driver). FIGS. 14A-B may be considered as generic schematics for any selected memory cell in respective layers, with the resistance of variable resistors $R_{WL}$ and $R_{BL}$ depending on the locations of the selected memory cells as illustrated by the examples of FIGS. 12-13B. The story in which a particular memory cell is located may affect series resistance because, for example, current flow may be in a different direction and different lines may be used (e.g., in FIG. 11A, Story 0 is accessed through word line 1 while Story 1 is accessed through word line 2). Additional factors (e.g., in addition to story and location in WL and BL directions) may also affect series resistance when accessing different memory cells (e.g., differences in memory structure caused by process variation, differences caused by environmental factors such as temperature and/or other differences).

According to aspects of the present technology, one or more variable resistor may be connected in series with a selected nonvolatile memory cell and may be set according to the location of the selected nonvolatile memory cell (e.g., according to story and location along WL and BL directions). For example, when an address is received (e.g., an address received from a host, memory controller or otherwise in a memory access command such as a write command) that corresponds to a location in a nonvolatile memory cell structure, the variable resistor(s) may be set to an appropriate resistance value(s) that depends on the location according to a relationship that may be previously established. The variable resistor(s) may be used to balance effects of different story, word line and/or bit line resistance and/or other factors so that the total series resistance of a selected word line, selected bit line and the variable resistance is substantially equal for all memory cells at all locations in the nonvolatile memory cell structure. For example, where WL and/or BL resistance is relatively low (e.g., memory cells 1670 or 1332), the variable resistor(s) may be set to a relatively high resistance. Where WL and/or BL resistance is relatively high (e.g., memory cells 1672 or 1342), the variable resistor(s) may be set to a relatively low resistance. “Substantially equal” in this context may mean that the total series resistance of a selected word line, selected bit line and the variable resistance(s) for all memory cells is within a range (e.g., +/−1%, 2%, 5% or 10% of mean value) where the appropriate range may be selected according to the impact of different series resistances in a given memory structure.

Figures 15A, 15B:
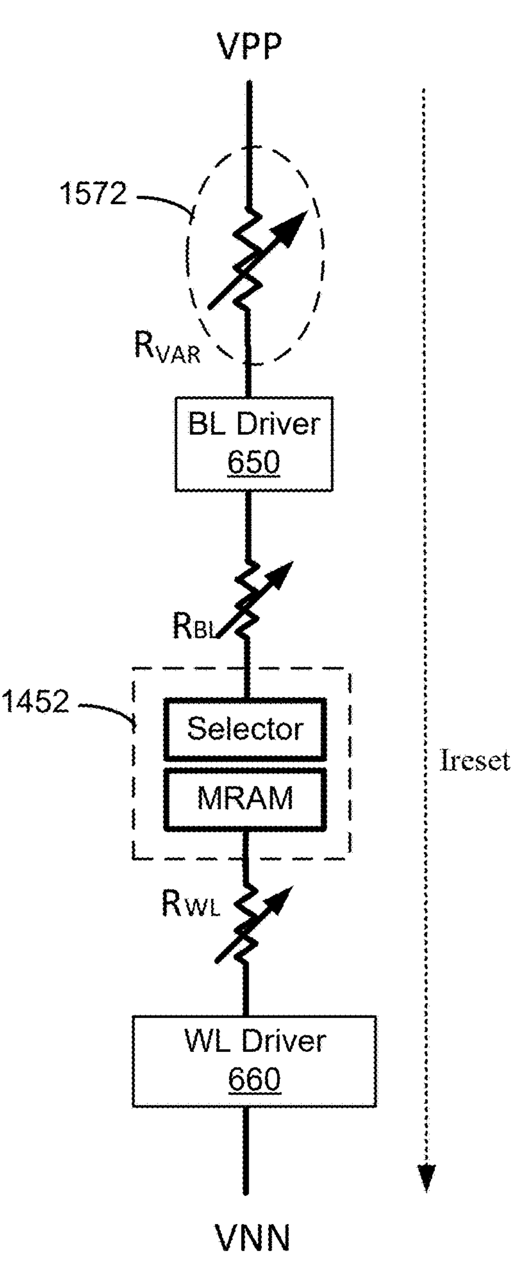

FIGS. 15A-B illustrate examples of variable resistors that are connected in series with selected nonvolatile memory cells in Story 0 (layer 0) and Story 1 (layer 1) respectively (e.g., FIGS. 15A-B are schematic illustrations corresponding to FIGS. 14A-B, with the addition of variable resistors).

FIG. 15A shows variable resistor 1570, with resistance $R_{VAR}$, connected in series with selected memory cell 1450, and with selected word and bit lines having resistances $R_{WL}$ and $R_{BL}$ respectively. As the series resistances $R_{WL}$ and $R_{BL}$ vary according to the location of selected memory cell 1450, variable resistor 1570 may be set to a resistance value that may tend to keep the total series resistance constant (e.g., such that $R_{WL}+R_{BL}+R_{VAR}$=constant), which may also tend to ensure substantially equal memory access currents (e.g., Ireset) from location to location. For example if the value of $R_{WL}+R_{BL}+R_{VAR}$ is within a range +/−1%, 2%, 5% or 10% of a mean resistance value then Ireset may be expected to remain within a corresponding range of +/−1%, 2%, 5% or 10% of a mean current value. The appropriate range may be selected according to the impact of different series resistances and currents in a given memory structure.

Similarly, in FIG. 15B, variable resistor 1572 may be set to a resistance value according to the location of selected memory cell 1452 that may tend to keep the total series constant, which may also tend to keep Ireset constant. For example, control circuits on the same die as the memory structure or on another die may set the variable resistor to a resistance value that depends on the location such that the resistance value for locations corresponding to higher combined word line resistance and bit line resistance is a lower resistance value and the resistance value for locations with lower combined word line resistance and bit line resistance is set to a higher resistance value. The resistance value for locations corresponding to higher combined word line resistance and bit line resistance may be set to a lower resistance value and the resistance value for locations with lower combined word line resistance and bit line resistance may be set to a higher resistance value. Locations corresponding to higher combined word line resistance and bit line resistance may be located in one or more corner area of the nonvolatile memory structure (e.g., as shown in FIGS. 12 and 13B) and locations corresponding to lower combined word line resistance and bit line resistance are located in another corner area (e.g., as shown in FIG. 12) or a central area of the nonvolatile memory structure (e.g., as shown in FIG. 13A).

Figures 15C, 15D:
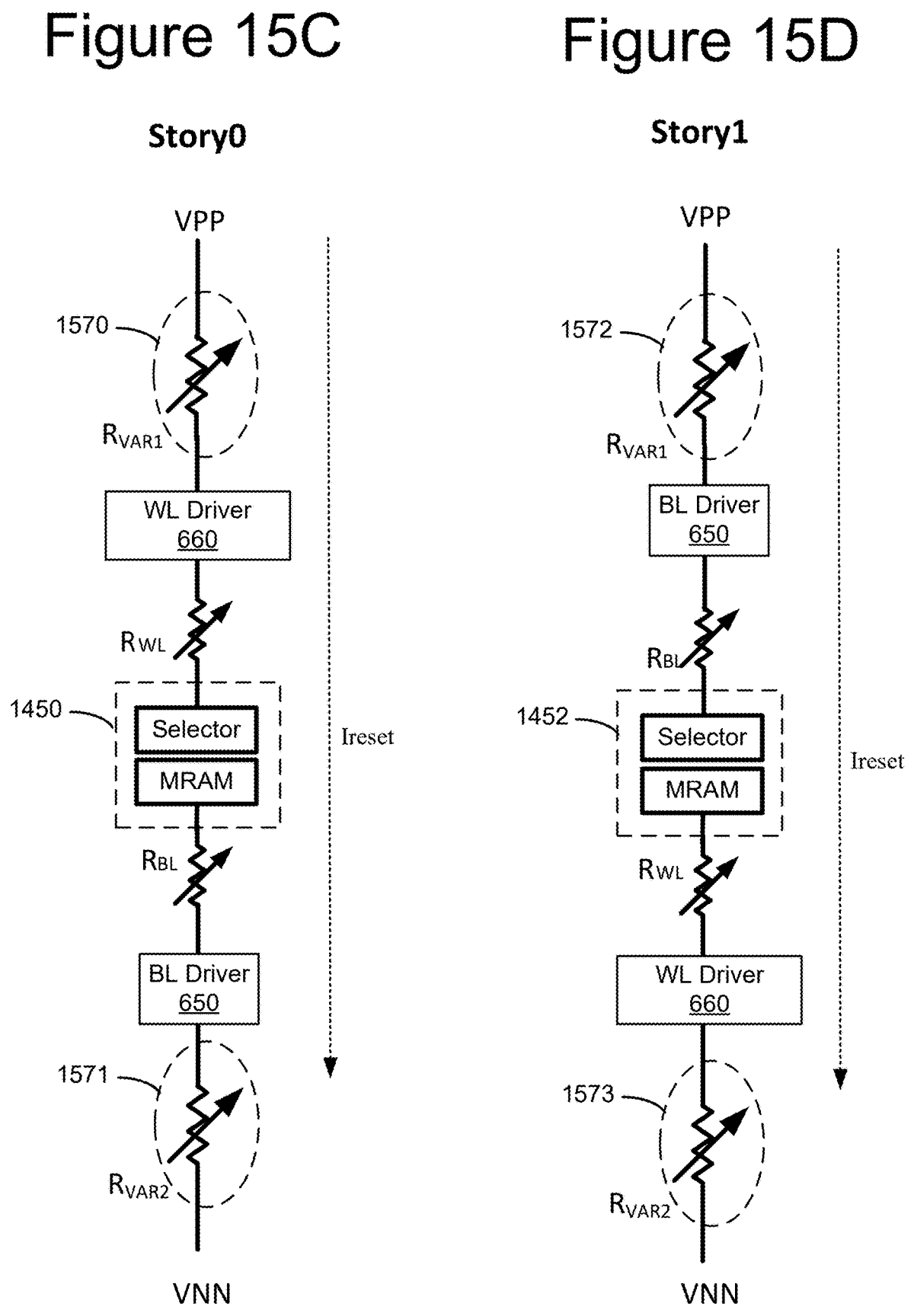

While FIGS. 15A-B show examples that each use a single variable resistor to implement aspects of the present technology, in other examples, two or more variable resistors may be used. FIGS. 15C-D show examples that use two variable resistors in story 0 and story 1 respectively.

FIG. 15C shows an example that includes a first variable resistor 1570 having resistance $R_{VAR1}$ and a second variable resistor 1571 having resistance $R_{VAR2}$ connected in series with selected memory cell 1450 and corresponding selected WL and BL. The combined resistance of first resistor 1570 and second resistor 1571 may be controlled according to location of selected memory cell 1450 and/or other factors to provide substantially uniform total series resistance. For example, as the series resistances $R_{WL}$ and $R_{BL}$ vary according to the location of selected memory cell 1450, first and second variable resistors 1570 and 1571 may be set to a resistance values that may tend to keep the total series resistance constant (e.g., such that $R_{WL}+R_{BL}+R_{VAR1}+R_{VAR2}$=constant), which may also tend to ensure substantially equal memory access currents (e.g., Ireset) from location to location. In an example, each variable resistor is separately controlled to compensate for variable resistance of a corresponding line (e.g., BL or WL) so that, for example, $R_{WL}+R_{VAR1}$=constant and $R_{BL}+R_{VAR2}$=constant.

FIG. 15D shows an example that includes a first variable resistor 1572 having resistance $R_{VAR1}$ and a second variable resistor 1573 having resistance $R_{VAR2}$ connected in series with selected memory cell 1452 and corresponding selected WL and BL in story 1. The combined resistance of first resistor 1572 and second resistor 1573 may be controlled according to location of selected memory cell 1452 and/or other factors to provide substantially uniform total series resistance. For example, as the series resistances $R_{WL}$ and $R_{BL}$ vary according to the location of selected memory cell 1452, first and second variable resistors 1572 and 1573 may be set to a resistance values that may tend to keep the total series resistance constant (e.g., such that $R_{WL}+R_{BL}+R_{VAR1}+R_{VAR2}$=constant), which may also tend to ensure substantially equal memory access currents (e.g., Ireset) from location to location. The number and locations of variable resistors shown in these examples are for illustration purposes and it will be understood that variable resistance may be added using any number of variable resistors connected at any suitable location or locations.

Appropriate series resistances may be implemented in different ways. For example, memory cells in a memory structure may be zoned according to distance from driver circuits or connections to driver circuits and associated series resistance of respective word lines and bit lines (for example memory cell 1332 may be in a first zone while memory cell 1342 may be in a second zone). The number of such zones may be chosen according to the range of WL and BL resistances and the desired degree of current uniformity for a given memory structure. The number of zones may be from two up to the number of memory cells. In memory structures that have layers or stories with different configurations, different stories may receive different resistances (e.g., different values of $R_{VA}$) so that an appropriate series resistance may be chosen based on a location that is specified by a zone and a story.

In some examples, settings for variable resistors may be obtained by testing memory dies to optimize resistance values. For example, resistance values for story 1 may be different from story 2 in addition to differences according to location based on word line and bit line resistance. Other factors may also affect memory access operations and may be addressed using a variable resistance. For example, temperature and/or other environmental factors may affect memory access operations. In some examples, one or more variable resistance may be used to compensate for temperature-related effects (e.g., a resistance value may be selected according to temperature and/or location). When resistance values are obtained, they may be stored in a record (e.g., a lookup table or other structure stored in the memory die) for subsequent use when accessing the memory cell structure.

In an example, an access current, in this case a write current (reset current) may be approximated by the following equation:

$$I_{write} = \frac{V_{supply} - V_{selector}}{R_{VAR} + R_{MRAM} + R_{BL} + R_{WL} + R_{CMOS}}$$

Where: $V_{supply}$=total supply voltage across the path (e.g., VPP+VNN);

$V_{selector}$=voltage drop across ON selector;

$R_{VAR}$=resistance of variable resistor(s) (e.g., $R_{VAR}$ of variable resistor 1570 or combination of $R_{VAR1}$ and $R_{VAR2}$ of variable resistors 1570 and 1571);

$R_{MRAM}$=voltage drop across MRAM, depends on state of the MRAM;

$R_{BL}$=voltage drop across BL wire;

$R_{WL}$=voltage drop across WL wire; and $R_{CMOS}$=voltage drop across all CMOS devices in the path.

By adjusting the value of $R_{VAR}$, uniformity of Iwrite may be achieved for a range of different locations with different $R_{BL}$ and $R_{WL}$ (e.g., Iwrite for all locations may be maintained within a predetermined range).

Figure 16:
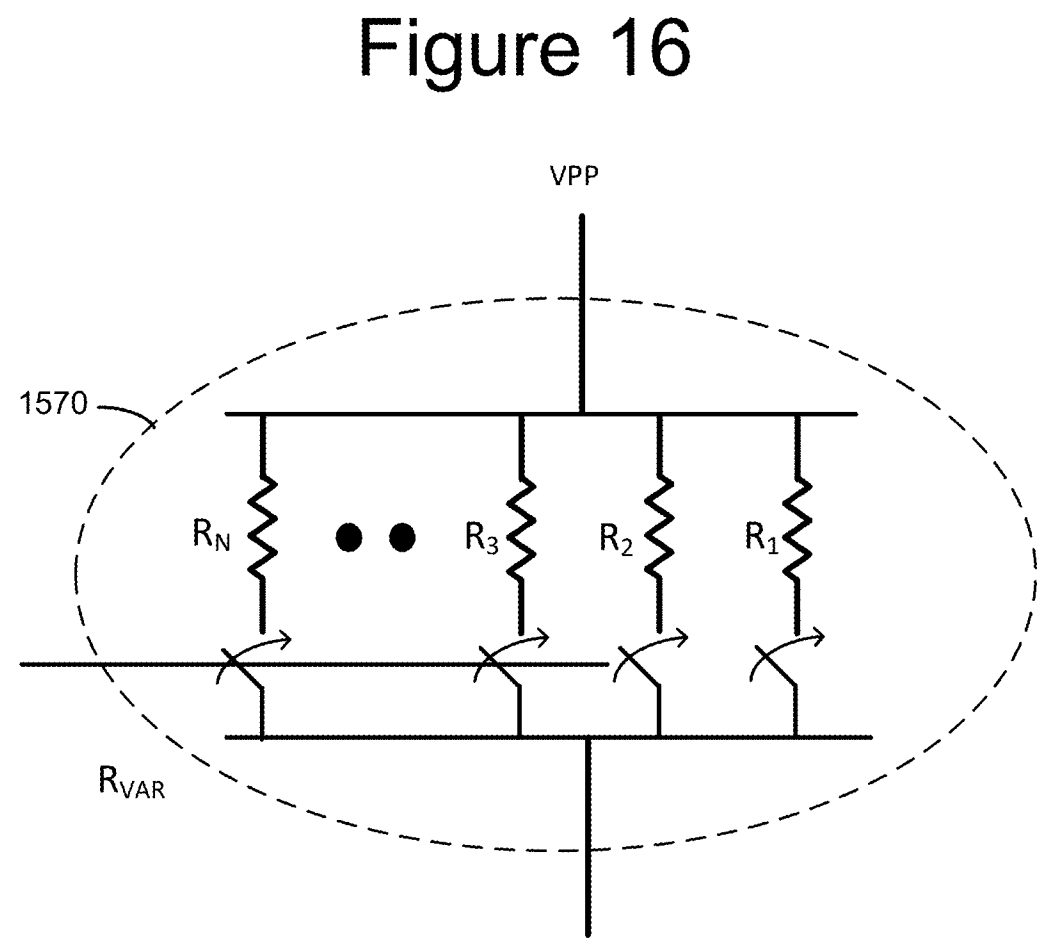

A variable resistor for connection in series with a memory cell (e.g., variable resistors 1570 and/or 1572) may be implemented in any suitable manner. FIG. 16 shows an example implementation which variable resistor 1570 includes N switchable resistors connected in parallel (e.g., between a driver circuit such as WL Driver 660 or BL Driver 650 and a word line or bit line of the nonvolatile memory cell structure). The resistance $R_{VAR}$ of variable resistor 1570 depends on which resistors are enabled by closing respective switches. The resistance of each switchable resistor, R1 to $R_N$, may be configured to provide a wide range of possible resistance values. For example R1 may be a relatively small resistance, R2 may be 2×R1, R3 may be 4×R1, R4 may be 8×R1 and so on in powers of 2, with $R_N=2^N\times$R1. By enabling only selected resistors a desired resistance may be obtained.

Figure 17A:
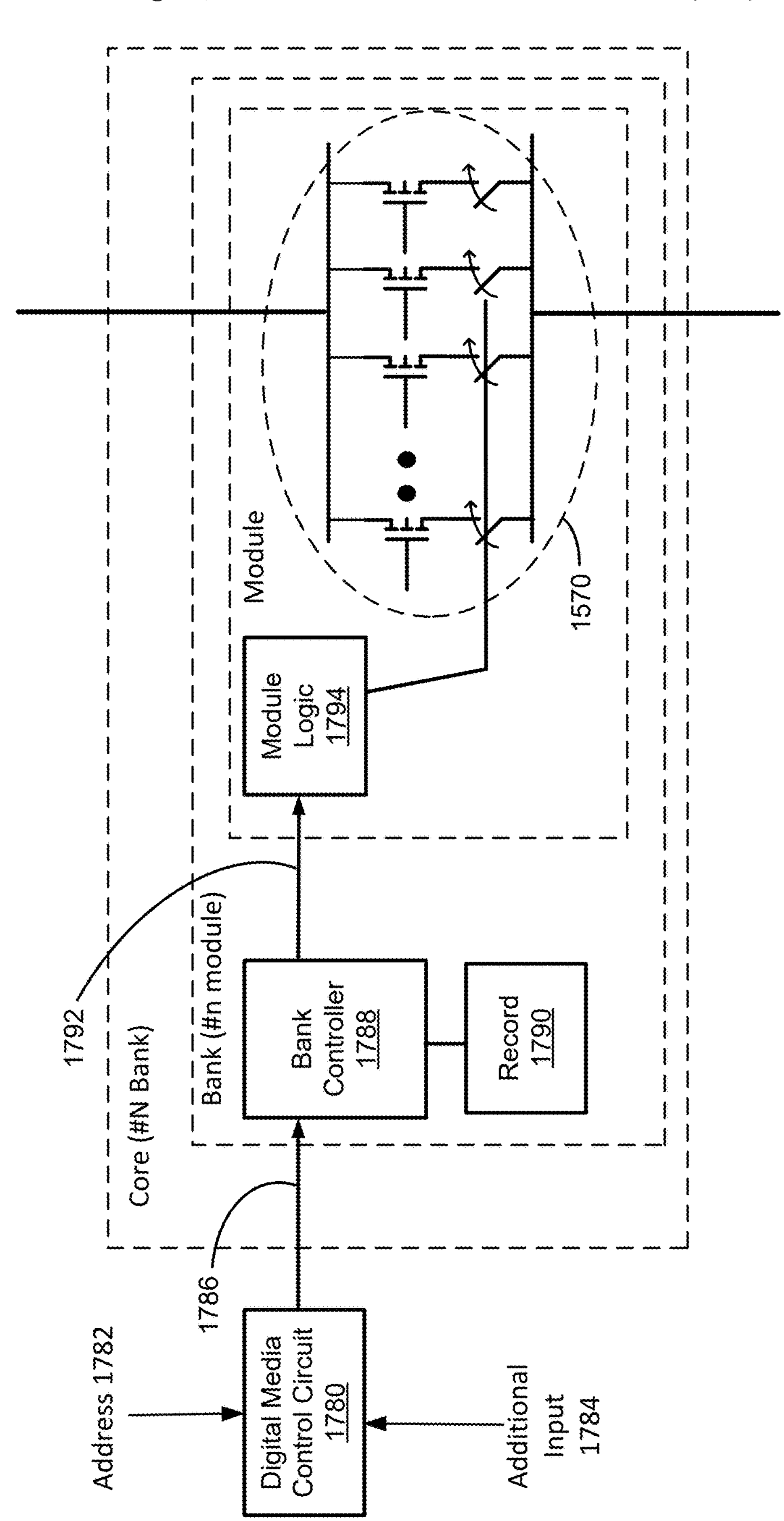
FIGS. 17A-B show examples of control circuits to control variable resistors.

FIG. 17A shows an example of control circuits that may be used to control resistance of a variable resistor (e.g., variable resistor 1570) in any of the previous examples. Variable resistor 1570 is shown having a plurality of switchable resistors that are formed by CMOS devices (e.g., dimensions of CMOS devices may be selected to produce appropriate resistances R1 to $R_N$). A digital media control circuit 1780 receives an address 1782 (e.g., an address received in a write command or other memory access command from a memory controller).

Digital media control circuit 1780 may also receive additional input 1784. For example, additional input 1784 may include temperature or other data regarding a condition that may affect memory access operations. In one example, temperature is obtained from an on-chip temperature measurement circuit (e.g., temperature measurement circuits 563 and 663) and is received as additional input 1784 by digital media control circuit 1780. Digital media control circuit 1780 may use address 1782 to generate location information in an appropriate format. For example, location information may be generated in the form of a zone (e.g., where memory cells in a memory structure are zoned according to their location along the WL and BL directions and associated series resistances of WLs and BLs) and a story (e.g., where a memory structure had stories or layers with different characteristics (e.g., as illustrated in FIGS. 11A-B).

Digital media control circuit 1780 sends data 1786 to Bank Controller 1788, where data 1786 may include location information (e.g., zone and story) along with any other information (e.g., temperature). Bank Controller 1788 may use data 1786 to determine appropriate series resistances (e.g., values for $R_{VAR}$). For example, Bank Controller 1788 may check received location and/or other data of data 1786 for corresponding entries in record 1790. Record 1790 may be in the form of a lookup table or other such structure with entries that link zones and/or temperatures to resistor settings. Record 1790 may be stored in registers 561, 661 or other such structure. Resistor settings 1792 (e.g., in the form of trim bits or otherwise) from record 1790 are sent to module logic 1794. Module logic 1794 generates signals to enable/disable selected switchable resistors of variable resistor 1570 according to resistor settings 1792 (e.g., to close switches to enable corresponding resistors to achieve a desired value of $R_{VAR}$).

Figure 17B:
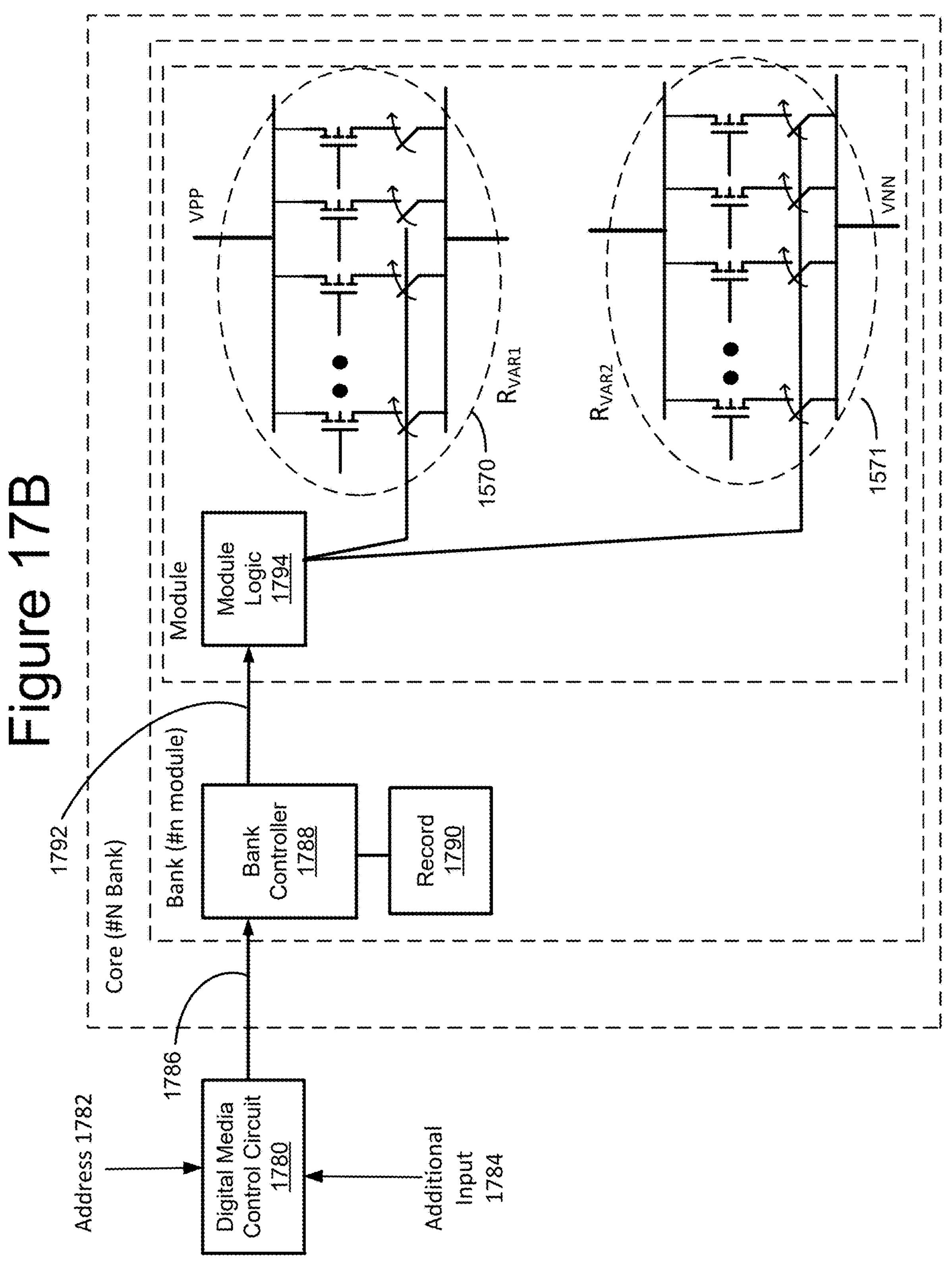

FIG. 17B shows an example of control circuits that may be used to control resistances of two variable resistors (e.g., variable resistor 1570 and variable resistor 1571 of FIG. 15C). Variable resistors 1570 and 1571 are each shown having a plurality of switchable resistors that are formed by CMOS devices (e.g., dimensions of CMOS devices may be selected to produce appropriate resistances R1 to RN). Digital media control circuit 1780, Bank Controller 1788 and record 1790 may operate as previously described. Module logic 1794 generates signals to enable/disable selected switchable resistors of variable resistor 1570 and variable resistor 1571 according to resistor settings 1792 (e.g., to close switches to enable corresponding resistors to achieve desired values of $R_{VAR1}$ and $R_{VAR2}$).

The components shown in FIGS. 17A-B may be considered an example of means for setting a variable resistor (e.g., variable resistor 1570) to a resistance value selected according to a location in the nonvolatile memory cell structure of a nonvolatile memory cell to be accessed and accessing the nonvolatile memory cell by passing a current through the variable resistor in series with the nonvolatile memory cell (e.g., in combination with read and/or write circuits such as row control circuitry 520 and column control circuitry 510 and/or system control logic 560).

While the examples of FIGS. 17A-B show specific components in particular arrangements, aspects of the present technology may be implemented using different components in different arrangements. For example, control circuitry used to implement aspects of the present technology including digital media control circuit 1780, bank controller 1788, record 1790, module logic 1794 and variable resistor 1570 may be located on a memory die (e.g., on the same die as a memory structure connected to variable resistor 1570) or on another die (e.g., control die) or some combination (e.g., some circuits on-chip and some off-chip).

FIG. 18 shows an example of a method according to aspects of the present technology. The method includes receiving a plurality of addresses corresponding to locations in a cross-point Magnetoresistive Random Access Memory (MRAM) structure 1810 (e.g., receiving addresses in memory access commands such as write commands), setting a plurality of variable resistors, the variable resistors connected in series with selected nonvolatile memory cells at the locations, each variable resistor set to a respective resistance value that depends on the location of the selected nonvolatile memory cell with which it is connected 1812 (e.g., setting RVAR of variable resistor 1570 according to location) and driving memory access currents through the selected nonvolatile memory cells and the variable resistors 1814 (e.g., driving Ireset as shown in FIGS. 15A-B to write data).

Figure 19:
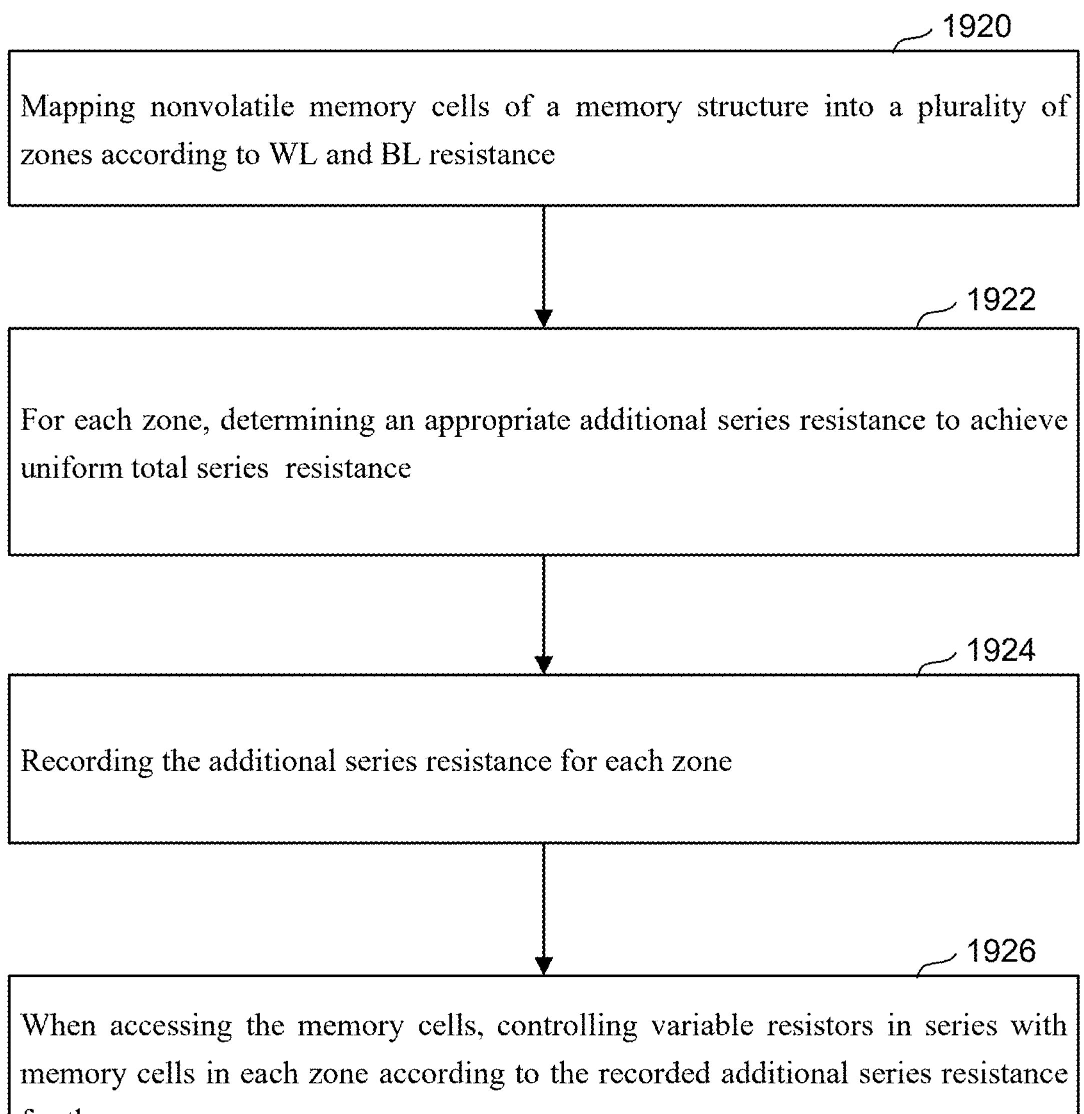
FIG. 19 shows an example of a method that includes determining and recording series resistance.

FIG. 19 shows an example of a method that may be used to configure a data storage system. The method includes mapping nonvolatile memory cells of a memory structure into a plurality of zones according to WL and BL resistance 1920 (e.g., from "near" cells with low WL and BL resistance to "far" cells with high WL and BL resistance) and for each zone, determining an appropriate additional series resistance to achieve uniform total series resistance 1922 (e.g., determining an appropriate value of $R_{VAR}$ to achieve more uniform current when accessing memory cells in different zones). The method further includes, recording the additional series resistance for each zone 1924 (e.g., in record 1790) and when accessing the memory cells, controlling variable resistors in series with memory cells in each zone according to the recorded additional series resistance for the zone 1926 (e.g., controlling $R_{VAR}$ of variable resistor 1570 according to data from record 1790).

The method shown in FIG. 19 may be carried out in a one-time operation for a wide range of memory structures. For example, appropriate additional series resistances may be determined by calculation or by experimentation and may be loaded and used in all similar memory dies. Alternatively, appropriate additional series resistances may be obtained on a die-by-die, plane-by-plane, block-by-block or other basis and may be customized accordingly so that different dies use different resistances and/or different portions of a memory structure within a die use different resistances. In some cases, some or all steps of the process of FIG. 19 may be carried out more than once on a given memory structure or portion thereof. For example, after a period of use, step 1922 may be performed to obtain new additional series resistances, which may be recorded and subsequently used for accessing memory cells. Such an operation may be triggered by elapsed time, usage (e.g., write-erase cycle count), error rate (e.g., found by ECC decoding) or other triggering event.

According to a first set of aspects, an apparatus includes one or more control circuit configured to connect to a nonvolatile memory cell structure that includes nonvolatile memory cells each having a programmable resistive element. The one or more control circuit is configured to receive an address that corresponds to a location in the nonvolatile memory cell structure and set a variable resistor according to the location. The variable resistor is connected in series with a selected nonvolatile memory cell that is located at the location. The one or more control circuit is further configured to drive a memory access current through the selected nonvolatile memory cell and the variable resistor in series.

In one or more example of the above apparatus, the one or more control circuit is connected to a memory controller and is configured to receive the address from the memory controller in a command from the memory controller.

In one or more example of the above apparatus, the command is a write command to write data at the location in the nonvolatile memory and the memory access current is a write current.

In one or more example of the above apparatus, the one or more control circuit is configured to set the variable resistor to a resistance value that depends on the location such that the resistance value for locations corresponding to higher combined word line resistance and bit line resistance is a lower resistance value and the resistance value for locations with lower combined word line resistance and bit line resistance is set to a higher resistance value.

In one or more example of the above apparatus, the higher combined word line resistance and bit line resistance in series with the lower resistance value is substantially equal to the lower combined word line resistance and bit line resistance in series with the higher resistance value.

In one or more example of the above apparatus, the locations corresponding to higher combined word line resistance and bit line resistance are located in one or more corner area of the nonvolatile memory cell structure and the locations corresponding to lower combined word line resistance and bit line resistance are located in a central area of the nonvolatile memory cell structure.

In one or more example of the above apparatus, the variable resistor includes a plurality of switchable resistors connected in parallel between a driver circuit and a word line or bit line of the nonvolatile memory cell structure.

In one or more example of the above apparatus, the nonvolatile memory cell structure includes a plurality of word lines extending along a word line direction, a plurality of bit lines extending along a bit line direction that is perpendicular to the word line direction, a plurality of nonvolatile memory cells extending vertically, each nonvolatile memory cell connected between a respective word line and a respective word line.

In one or more example of the above apparatus, each nonvolatile memory cell includes a selector connected in series with the programmable resistive element.

According to another set of aspects, a method includes receiving a plurality of addresses corresponding to locations in a cross-point Magnetoresistive Random Access Memory (MRAM) structure; setting a plurality of variable resistors, the variable resistors connected in series with selected nonvolatile memory cells at the locations, each variable resistor set to a respective resistance value that depends on a location of a selected nonvolatile memory cell with which it is connected; and driving memory access currents through the selected nonvolatile memory cells and the variable resistors.

In one or more example of the above method, each variable resistor is set to a respective value that depends on the location of the selected nonvolatile memory cell with which it is connected such that series resistance of respective word line, bit line and variable resistor is substantially equal for each selected nonvolatile memory cell.

In one or more example of the above method, driving the memory access currents includes driving substantially equal memory access currents through each of the selected nonvolatile memory cells.

In one or more example of the above method, setting the plurality of variable resistors includes, for each variable resistor, enabling only selected resistors from a plurality of resistors connected in parallel.

In one or more example of the above method, setting the plurality of variable resistors includes checking each address against a record that indicates corresponding resistors to select.

In one or more example of the above method, the method further includes measuring temperature at a location at or near the cross-point MRAM structure; and setting the plurality of variable resistors to the respective resistance values according to the locations and the temperature.

In one or more example of the above method, the method further includes testing a die that includes the MRAM structure to determine respective resistance values for the locations; and storing the respective resistance values for the die in the die.

In one or more example of the above method, the method further includes, subsequent to storing the respective resistance values, using the respective resistance values for memory access operations for a first period of time; subsequently, repeating testing of the die to determine new respective resistance values for the locations; storing the new respective resistance values in the die; and subsequently using the new respective resistance values for a second period of time.

In another set of aspects, a system includes a nonvolatile memory cell structure that includes nonvolatile memory cells each having a programmable resistive element; and means for setting a variable resistor to a resistance value selected according to a location in the nonvolatile memory cell structure of a nonvolatile memory cell to be accessed and accessing the nonvolatile memory cell by passing a current through the variable resistor in series with the nonvolatile memory cell.

In one or more example of the above system, the system further includes a temperature measurement circuit that is connected to the means for setting the variable resistor to provide a temperature measurement to the means for setting the variable resistor for use in selecting the resistance value.

In one or more example of the above system, the nonvolatile memory cell structure is located on a memory die and the means for setting the variable resistor is located on a control die that is bonded to the memory die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:

one or more control circuit configured to connect to a nonvolatile memory cell structure that includes nonvolatile memory cells each having a programmable resistive element, the one or more control circuit configured to:

receive an address that corresponds to a location in the nonvolatile memory cell structure;

set a variable resistor according to the location, the variable resistor connected in series with conductive lines connected to a selected nonvolatile memory cell that is located at the location, the variable resistor set such that the sum of the resistance of the conductive lines and the variable resistor is within a predetermined range; and drive a memory access current through the selected nonvolatile memory cell, the conductive lines and the variable resistor in series.

2. The apparatus of claim 1, wherein the one or more control circuit is connected to a memory controller and is configured to receive the address from the memory controller in a command from the memory controller.

3. The apparatus of claim 2, wherein the command is a write command to write data at the location in the nonvolatile memory and the memory access current is a write current.

4. The apparatus of claim 1, wherein the one or more control circuit is configured to set the variable resistor to a resistance value that depends on the location such that the resistance value for locations corresponding to higher combined word line resistance and bit line resistance is a lower resistance value and the resistance value for locations with lower combined word line resistance and bit line resistance is set to a higher resistance value such that the sum of the resistance of the conductive lines and the variable resistor is constant.

5. The apparatus of claim 4, wherein the higher combined word line resistance and bit line resistance in series with the lower resistance value is substantially equal to the lower combined word line resistance and bit line resistance in series with the higher resistance value.

6. The apparatus of claim 5, wherein the locations corresponding to higher combined word line resistance and bit line resistance are located in one or more corner area of the nonvolatile memory cell structure and the locations corresponding to lower combined word line resistance and bit line resistance are located in a central area of the nonvolatile memory cell structure.

7. The apparatus of claim 1, wherein the variable resistor includes a plurality of switchable resistors connected in parallel between a driver circuit and a word line or bit line of the nonvolatile memory cell structure.

8. The apparatus of claim 1, wherein the nonvolatile memory cell structure includes a plurality of word lines extending along a word line direction, a plurality of bit lines extending along a bit line direction that is perpendicular to the word line direction, a plurality of nonvolatile memory cells extending vertically, each nonvolatile memory cell connected between a respective word line and a respective word line.

9. The apparatus of claim 8, wherein each nonvolatile memory cell includes a selector connected in series with the programmable resistive element.

10. A method, comprising:

receiving a plurality of addresses corresponding to a plurality of locations in a cross-point Magnetoresistive Random Access Memory (MRAM) structure that includes word lines extending along a first direction and bit lines extending along a second direction that is perpendicular to the first direction;

setting a plurality of variable resistors, the variable resistors connected in series with selected nonvolatile memory cells at the locations and in series with word lines and bit lines connected to the selected nonvolatile memory cells, each variable resistor set to a respective resistance value that depends on a location of a selected nonvolatile memory cell with which it is connected such that, for each location, the sum of resistance of the connected word line, bit line and the variable resistor is within a predetermined range; and driving memory access currents through the selected nonvolatile memory cells in series with connected word and bit lines and the variable resistors.

11. The method of claim 10, wherein each variable resistor is set to a respective value that depends on the location of the selected nonvolatile memory cell with which it is connected such that series resistance of respective word line, bit line and variable resistor is substantially equal for each selected nonvolatile memory cell.

12. The method of claim 10, wherein driving the memory access currents includes driving substantially equal memory access currents through each of the selected nonvolatile memory cells.

13. The method of claim 10, wherein setting the plurality of variable resistors includes, for each variable resistor, enabling only selected resistors from a plurality of resistors connected in parallel.

14. The method of claim 13, wherein setting the plurality of variable resistors includes checking each address against a record that indicates corresponding resistors to select.

15. The method of claim 10, further comprising:

measuring temperature at a location at or near the cross-point MRAM structure; and setting the plurality of variable resistors to the respective resistance values according to the locations and the temperature.

16. The method of claim 10, further comprising:

testing a die that includes the MRAM structure to determine respective resistance values for the locations; and storing the respective resistance values for the die in the die.

17. The method of claim 16, further comprising:

subsequent to storing the respective resistance values, using the respective resistance values for memory access operations for a first period of time;

subsequently, repeating testing of the die to determine new respective resistance values for the locations;

storing the new respective resistance values in the die; and subsequently using the new respective resistance values for a second period of time.

18. A system, comprising:

a nonvolatile memory cell structure that includes nonvolatile memory cells each having a programmable resistive element, each nonvolatile memory cell connected to a corresponding word line and a corresponding bit line; and means for setting a variable resistor to a resistance value selected according to a location in the nonvolatile memory cell structure of a nonvolatile memory cell to be accessed such that, for each location in the nonvolatile memory cell structure, the sum of resistance of the connected word line, bit line and the variable resistor is within a predetermined range and accessing the nonvolatile memory cell by passing a current through the variable resistor in series with the nonvolatile memory cell and the connected word line and bit line.

19. The system of claim 18, further comprising a temperature measurement circuit that is connected to the means for setting the variable resistor to provide a temperature measurement to the means for setting the variable resistor for use in selecting the resistance value.

20. The system of claim 18, wherein the nonvolatile memory cell structure is located on a memory die and the means for setting the variable resistor is located on a control die that is bonded to the memory die.

* * * * *